(12) United States Patent
Lin et al.

(10) Patent No.: US 11,894,259 B2
(45) Date of Patent: *Feb. 6, 2024

(54) METHOD FOR MANUFACTURING THE SAME HAVING A PROFILE MODIFIER

(71) Applicant: NANYA TECHNOLOGY CORPORATION, New Taipei (TW)

(72) Inventors: Shih-En Lin, New Taipei (TW); Jui-Lin Chin, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 173 days.

This patent is subject to a terminal disclaimer.

(21) Appl. No.: 17/666,037

(22) Filed: Feb. 7, 2022

(65) Prior Publication Data

US 2023/0253239 A1 Aug. 10, 2023

(51) Int. Cl.
*H01L 21/762* (2006.01)
*H01L 21/768* (2006.01)
*H01L 23/522* (2006.01)

(52) U.S. Cl.
CPC ...... *H01L 21/76224* (2013.01); *H01L 21/768* (2013.01); *H01L 21/76816* (2013.01);
(Continued)

(58) Field of Classification Search
CPC ............ H01L 21/76224; H01L 21/768; H01L 21/76816; H01L 21/76831; H01L 21/76834; H01L 21/76897; H01L 23/5226
See application file for complete search history.

(56) References Cited

U.S. PATENT DOCUMENTS

| 5,498,889 A | 3/1996 | Hayden |
| 7,928,577 B2 | 4/2011 | Sandhu et al. |

(Continued)

FOREIGN PATENT DOCUMENTS

| TW | I-677966 B | 11/2019 |
| TW | 202008561 A | 2/2020 |

(Continued)

OTHER PUBLICATIONS

Office Action dated May 10, 2023 from the counterpart U.S. Appl. No. 17/665,722, the search report attached to the Office Action; pp. 1-30.

(Continued)

*Primary Examiner* — Mohsen Ahmadi
(74) *Attorney, Agent, or Firm* — Muncy, Geissler, Olds & Lowe, P.C.

(57) ABSTRACT

A method for manufacturing a semiconductor device structure includes forming a first metallization line and a second metallization line extending along a first direction; forming a first isolation feature and a second isolation feature between the first metallization line and the second metallization line, wherein the first metallization line, the second metallization line, the first isolation feature and the second isolation feature define an aperture; forming a profile modifier within the aperture, wherein the profile modifier comprises a plurality of segments spaced apart from each other, wherein each of the segments are located at corners of the aperture; and forming a contact feature surrounded by the plurality of segments.

20 Claims, 34 Drawing Sheets

(52) U.S. Cl.
CPC .. *H01L 21/76831* (2013.01); *H01L 21/76834* (2013.01); *H01L 21/76897* (2013.01)

(56) References Cited

U.S. PATENT DOCUMENTS

| | | | |
|---|---|---|---|
| 2008/0203374 | A1 | 8/2008 | Chuo et al. |
| 2015/0287675 | A1* | 10/2015 | Shaviv .............. H01L 21/76846 |
| | | | 438/618 |
| 2018/0096932 | A1* | 4/2018 | Xie ................... H01L 21/76802 |
| 2020/0052128 | A1 | 2/2020 | Liu |
| 2021/0328052 | A1 | 10/2021 | Huang |
| 2021/0351175 | A1 | 11/2021 | Wang et al. |
| 2021/0407895 | A1* | 12/2021 | Lin ....................... H05K 3/0094 |
| 2022/0302210 | A1 | 9/2022 | Fratin et al. |

FOREIGN PATENT DOCUMENTS

| | | |
|---|---|---|
| TW | 202118029 A | 5/2021 |
| TW | 202118062 A | 5/2021 |
| TW | 202205628 A | 2/2022 |

OTHER PUBLICATIONS

Office Action dated Oct. 17, 2022 in TW Application No. 111115026, 4 pages.

Office Action dated Nov. 28, 2022 in TW Application No. 111115033, 9 pages.

* cited by examiner

METHOD FOR MANUFACTURING THE SAME HAVING A PROFILE MODIFIER

TECHNICAL FIELD

The present disclosure relates to a semiconductor device structure and method for manufacturing the same, and more particularly, to a semiconductor device structure including a profile modifier.

DISCUSSION OF THE BACKGROUND

With the rapid growth of the electronics industry, integrated circuits (ICs) have achieved high performance and miniaturization. Technological advances in IC materials and design have produced generations of ICs where each generation has smaller and more complex circuits than the previous generation.

Contacts are used to make connections in or among different features in a semiconductor structure. A contact is used, for example, to connect one conductive feature to another conductive feature. In some situations, the openings that the contact materials fill may have voids formed therein, adversely affecting electrical connection between conductive features. Therefore, a new semiconductor device structure and method of improving such problems is required.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a semiconductor device structure. The semiconductor device structure includes a first metallization line, a second metallization line, a first isolation feature, a second isolation feature, a profile modifier, and a contact feature. The first metallization line and the second metallization line extend along a first direction. The first isolation feature and the second isolation feature are disposed between the first metallization line and the second metallization line. The first metallization line, the second metallization line, the first isolation feature and the second isolation feature define an aperture. The profile modifier is disposed within the aperture to modify a profile of the aperture in a plan view. The contact feature is disposed within the aperture.

Another aspect of the present disclosure provides another semiconductor device structure. The semiconductor device structure includes a first metallization line, a second metallization line, a first isolation feature, a second isolation feature, a profile modifier, and a contact feature. The first metallization line and the second metallization line extend along a first direction. The first isolation feature and the second isolation feature are disposed between the first metallization line and the second metallization line. The first metallization line, the second metallization line, the first isolation feature and the second isolation feature define an aperture. The profile modifier is disposed within the aperture. The profile modifier includes a plurality of segments spaced apart from each other. Each of the segments are located at corners of the aperture. The contact feature is disposed within the aperture.

Another aspect of the present disclosure provides a method for manufacturing a semiconductor device structure. The method includes: providing a substrate; forming a first metallization line and a second metallization line over the substrate, wherein the first metallization line and the second metallization line extend along a first direction; forming a first isolation feature and a second isolation feature between the first metallization line and the second metallization line, wherein the first metallization line, the second metallization line, the first isolation feature and the second isolation feature define an aperture; forming a profile modifier to modify a profile of the aperture in a plan view; and forming a contact feature within the aperture.

The embodiments of the present disclosure illustrate a semiconductor device structure with a profile modifier. In some embodiments, the profile modifier can be utilized to round an aperture for accommodating a contact feature such that the contact feature can have a partial circle, a partial ellipse or a partial oval profile in a plan view. When a conductive material is filled into a rounded aperture to form the contact feature, no or fewer voids can be formed therein, which can improve yields of manufacturing the semiconductor device structure.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1:
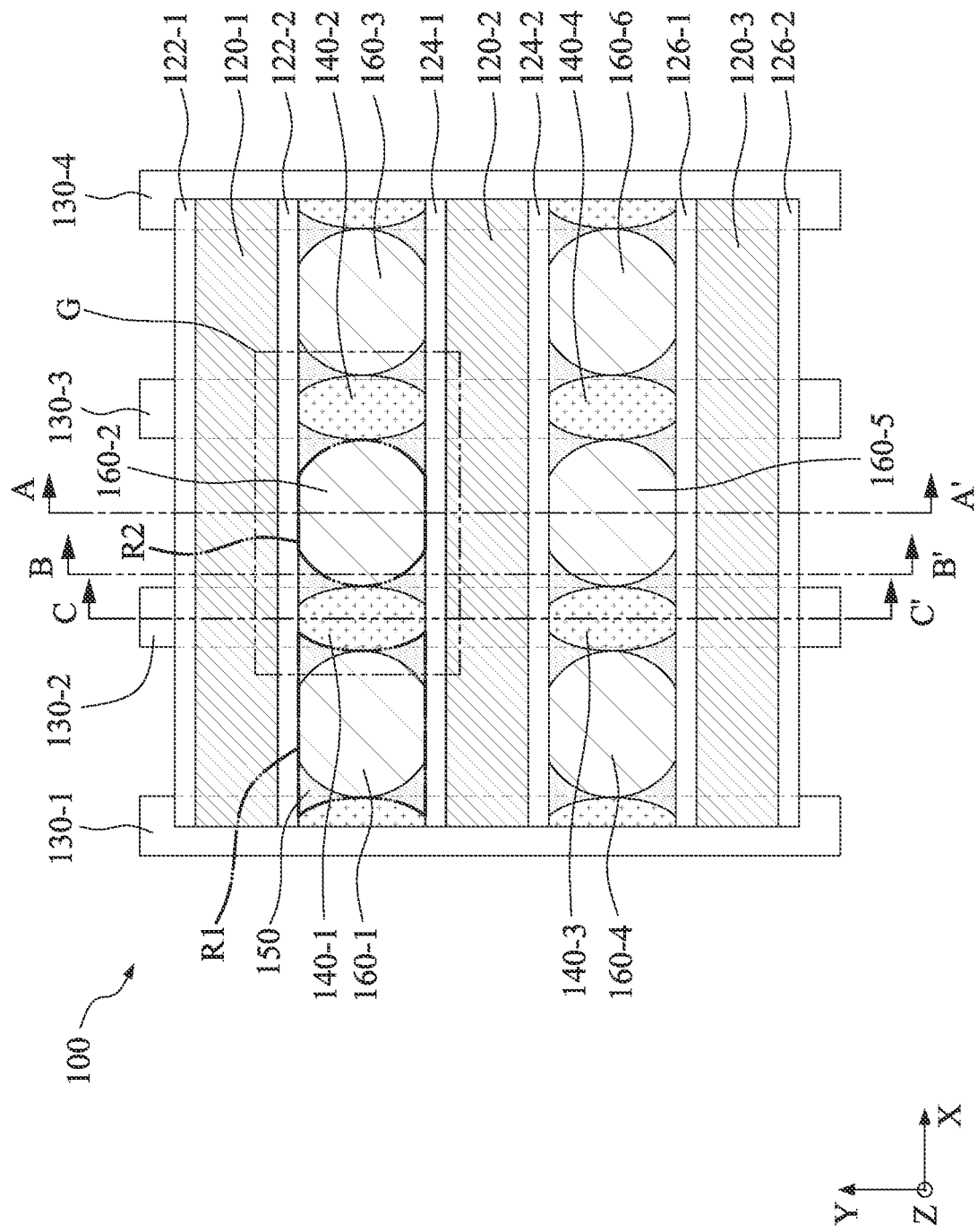
FIG. 1 is a top view of a layout of a semiconductor device structure, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a top view of a layout of a semiconductor device structure 100, in accordance with some embodiments of the present disclosure.

In some embodiments, the semiconductor device structure 100 can include active components and/or passive components. The active component may include a memory die (e.g., dynamic random access memory (DRAM) die, a static random access memory (SRAM) die, etc.)), a power management die (e.g., power management integrated circuit (PMIC) die)), a logic die (e.g., system-on-a-chip (SoC), central processing unit (CPU), graphics processing unit (CPU), application processor (AP), microcontroller, etc.)), a radio frequency (RF) die, a sensor die, a micro-electro-mechanical-system (MEMS) die, a signal processing die (e.g., digital signal processing (DSP) die)), a front-end die (e.g., analog front-end (AFE) dies)) or other active components. The passive component may include a capacitor, a resistor, an inductor, a fuse or other passive components.

In some embodiments, the semiconductor device structure 100 can include a plurality of metallization lines 120-1, 120-2, and 120-3, a plurality of metallization lines 130-1, 130-2, 130-3, and 130-4, a plurality of isolation features 140-1, 140-2, 140-3, and 140-4, a plurality of profile modifiers 150, as well as a plurality of contact features 160-1, 160-2, 160-3, 160-4, 160-5, and 160-6.

In some embodiments, the metallization lines 120-1, 120-2, and 120-3 can extend along the X direction. The metallization lines 120-1, 120-2, and 120-3 can be parallel to each other along the Y direction. The metallization lines 120-1, 120-2, and 120-3 can be spaced apart from each other. In some embodiments, each of the metallization lines 120-1, 120-2, and 120-3 can serve as a bit line, which can be utilized to connect, but is not limited to, a gate structure (e.g., a bit line gate) and a contact (e.g., a bit line contact).

In some embodiments, the semiconductor device structure 100 can include a plurality of spacers 122-1, 122-2, 124-1, 124-2, 126-1, and 126-2. Each of the spacers 122-1, 122-2, 124-1, 124-2, 126-1, and 126-2 can be disposed on a sidewall of the metallization line (e.g., 120-1, 120-2, and 120-3). For example, the spacers 122-1 and 122-2 can be disposed on two opposite sidewalls of the metallization line 120-1. The spacers 122-2 and 124-1 can face each other. Each of the spacers 122-1, 122-2, 124-1, 124-2, 126-1, and 126-2 can extend along the X direction. Each of the spacers 122-1, 122-2, 124-1, 124-2, 126-1, and 126-2 can be parallel to each other along the Y direction. Each of the spacers 122-1, 122-2, 124-1, 124-2, 126-1, and 126-2 can be spaced apart from each other. Each of the spacers 122-1, 122-2, 124-1, 124-2, 126-1, and 126-2 can be utilized to isolate the metallization line from a contact feature (e.g., 160-1, 160-2, 160-3, 160-4, 160-5, and 160-6).

In some embodiments, the metallization lines 130-1, 130-2, 130-3, and 130-4 can extend along the Y direction. The metallization lines 130-1, 130-2, 130-3, and 130-4 can be parallel to each other along the X direction. The metallization lines 130-1, 130-2, 130-3, and 130-4 can be spaced apart from each other. In some embodiments, each of the metallization lines 130-1, 130-2, 130-3, and 130-4 can serve as a word line, which can be utilized to connect, but is not limited to, a gate structure (e.g., a word line gate) and a contact (e.g., a word line contact).

In some embodiments, the isolation features 140-1, 140-2, 140-3, and 140-4 can be disposed on two opposite sides of the contact feature (e.g., 160-1, 160-2, 160-3, 160-4, 160-5, or 160-6). In some embodiments, each of the isolation features 140-1, 140-2, 140-3, and 140-4 can be located between two metallization lines in a plan view. For example, the isolation features 140-1 and 140-2 can be located between the metallization lines 120-1 and 120-2.

In some embodiments, each of the isolation features 140-1, 140-2, 140-3, and 140-4 can have a partial circle profile, a partial ellipse profile or a partial oval profile in a plan view. For example, two sidewalls of the isolation feature 140-1, which extend from the metallization line 120-1 to the metallization line 120-2 (or from the spacer 122-2 to the spacer 124-1), can have an arch shape in a plan view. Each of the aforesaid sidewalls can have a convex surface in a plan view.

In some embodiments, each of the isolation features 140-1, 140-2, 140-3, and 140-4 can overlap one of the metallization lines (e.g., 130-1, 130-2, 130-3 and 130-4) along the Z direction. Although not shown, it should be noted that a contact feature (e.g., a word line contact) can penetrate one of the isolation features 140-1, 140-2, 140-3, and 140-4, and can be electrically connected to the a corresponding metallization line 130-1, 130-2, 130-3, or 130-4. In some embodiments, each of the isolation features 140-1, 140-2, 140-3, and 140-4 can be in contact with a sidewall of the spacer of the metallization line. For example, the isolation features 140-1 can be in contact with the spacers 122-2 and 124-1.

In some embodiments, the metallization lines (e.g., 120-1, 120-2, and 120-3) and the isolation features (e.g., 140-1, 140-2, 140-3, and 140-4) can define an aperture (e.g., R1). In some embodiments, the spacers (e.g., 122-1, 122-2, 124-1, 124-2, 126-1, and 126-2) of the metallization lines (e.g., 120-1, 120-2, 120-3) and the isolation features (e.g., 140-1, 140-2, 140-3, and 140-4) can define an aperture. For example, the spacer 122-2 of the metallization line 120-1, the spacer 124-1 of the metallization line 120-2, the isolation features 140-1 and 140-2 can define an aperture R1. In some embodiments, two edges, defined by two sidewalls of the isolation features (e.g., 140-1 and 140-2), can protrude toward each other in a plan view.

In some embodiments, the profile modifier 150 can be located within the aperture R1. In some embodiments, the profile modifier 150 can be located at the corners of the aperture R1. In some embodiments, the profile modifier 150 can be utilized to modify the profile of the aperture R1. In some embodiments, the profile modifier 150 can be utilized to round the profile of the aperture R1. In some embodiments, the profile modifier 150 can be utilized to define an aperture R2 (or a rounded aperture) with a partial circle profile, a partial ellipse profile or a partial oval profile. In some embodiments, the aperture R2 can be defined by the spacers (e.g., 122-1, 122-2, 124-1, 124-2, 126-1, and 126-2) of the metallization lines and the profile modifier 150. In some embodiments, the profile modifier 150 can overlap the metallization lines (e.g., 130-1, 130-2, 130-3 and 130-4) along the Z direction.

In some embodiments, the contact features 160-1, 160-2, 160-3, 160-4, 160-5, and 160-6 (or cell contact) can be arranged along the X direction. In some embodiments, each of the contact features 160-1, 160-2, 160-3, 160-4, 160-5, and 160-6 can be located between two metallization lines in a plan view. For example, the contact feature 160-1 can be located between the metallization lines 120-1 and 120-2. In some embodiments, the contact features (e.g., 160-1 and 160-2) can be spaced apart from each other by an isolation feature (e.g., 140-1). In some embodiments, each of the contact features 160-1, 160-2, 160-3, 160-4, 160-5, and 160-6 can have a partial circle profile, a partial ellipse profile or a partial oval profile in a plan view. In some embodiments, each of the contact features (160-1, 160-2, 160-3, 160-4, 160-5, and 160-6) can be in contact with a sidewall of the spacers (e.g., 122-1, 122-2, 124-1, 124-2, 126-1, and 126-2). In some embodiments, each of the contact features (160-1, 160-2, 160-3, 160-4, 160-5, and 160-6) can be in contact with a sidewall of the profile modifier 150. In some embodiments, each of the contact features (160-1, 160-2, 160-3, 160-4, 160-5, and 160-6) can be located within the aperture R1 or R2. In some embodiments, the profile of each of the contact features (160-1, 160-2, 160-3, 160-4, 160-5, and 160-6) can be modified or defined by the profile modifier 150.

Figure 2:
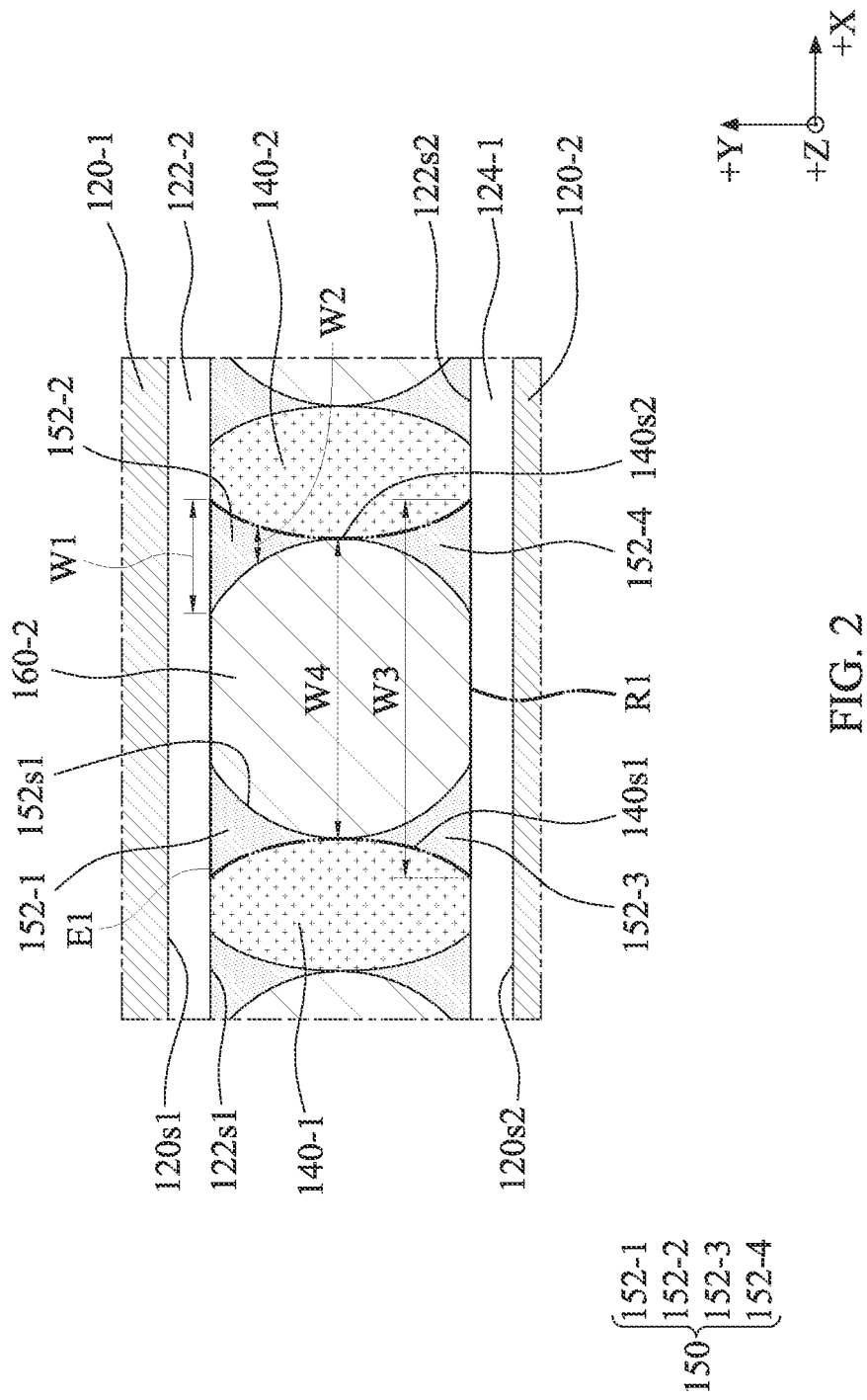
FIG. 2 is a partial enlarged view of region R of the semiconductor device structure as shown in FIG. 1, in accordance with some embodiments of the present disclosure.

FIG. 2 is a partial enlarged view of region G of the semiconductor device structure 100 as shown in FIG. 1, in accordance with some embodiments of the present disclosure.

As shown in FIG. 2, the metallization line 120-1 can have a sidewall 120$s$1 on which the spacer 122-2 is disposed on. The metallization line 120-2 can have a sidewall 120$s$2 on which the spacer 124-1 is disposed on.

The isolation features 140-1 have a sidewall 140$s$1 facing a sidewall 140-2 of the isolation features 140-2. In some embodiments, the sidewalls 140$s$1 and 140$s$2 can protrude or be convex toward each other. In some embodiments, the profile modifier 150 can include segments 152-1, 152-2, 152-3, and 152-4. In some embodiments, each of the segments 152-1, 152-2, 152-3, and 152-4 can be spaced apart from each other. In some embodiments, each of the segments 152-1, 152-2, 152-3, and 152-4 can be located within the aperture R1. In some embodiments, each of the segments 152-1, 152-2, 152-3, and 152-4 can be located at corners (e.g., E1) of the aperture R1. For example, the segments 152-1 can be located at a corner (e.g., E1) defined by a sidewall 122$s$1 of the spacer 122-2 of the metallization line 120-1 and the sidewall 140$s$1 of the isolation features 140-1. In some embodiments, each of the segments 152-1, 152-2, 152-3, and 152-4 can have a sidewall extending from the sidewall of the spacer (e.g., 122-1, 122-2, 124-1, 124-2, 126-1, and 126-2) and the sidewall of the isolation feature (e.g., 140-1, 140-2, 140-3, and 140-4). For example, the segments 152-1 can have a sidewall 152$s$1 extending from the sidewall 122$s$1 of the spacer 122-2 to the sidewall 140$s$1 of the isolation feature 140-1.

In some embodiments, each of the segments 152-1, 152-2, 152-3, and 152-4 can be tapered along the Y direction. For example, the segments 152-1 is tapered along the negative Y direction, and the segments 152-3 is tapered along the positive Y direction. In some embodiments, each of the segments 152-1, 152-2, 152-3, and 152-4 can be tapered toward the corner (e.g., E1) of the aperture R1. In some embodiments, the sidewall of the profile modifier 150 can be concave with respect to the contact feature (e.g., 160-1, 160-2, 160-3, 160-4, 160-5, and 160-6). For example, the sidewall 152$s$1 is concave with respect to a sidewall of the contact features 160-2.

In some embodiments, each of the segments (e.g., 152-1) can have a width W1 at a sidewall 122$s$1 of the spacer 122-2 along the X direction and a width W2 between the spacers 122-2 and 122-3 along the X direction. The width W1 is greater than the width W2. In some embodiments, a portion of the sidewall (e.g., 122$s$1) of the spacer 122-2 is exposed from the profile modifier 150.

In some embodiments, the contact feature (e.g., 160-2) can be surrounded by the segments 152-1, 152-2, 152-3, and 152-4 of the profile modifier 150.

In some embodiments, the sidewall of the isolation feature (e.g., 140-1, 140-2, 140-3, and 140-4) can be convex with respect to the profile modifier 150. For example, the sidewall 140s1 of the isolation features 140-1 can be convex with respect to the segment 152-1 or 152-3.

In some embodiments, the aperture R1 can have a width W3 at a sidewall 122s1 of the spacer 122-2 along the X direction and a width W4 between the spacers 122-2 and 122-3 along the X direction. The width W3 is greater than the width W4.

Figure 3A:
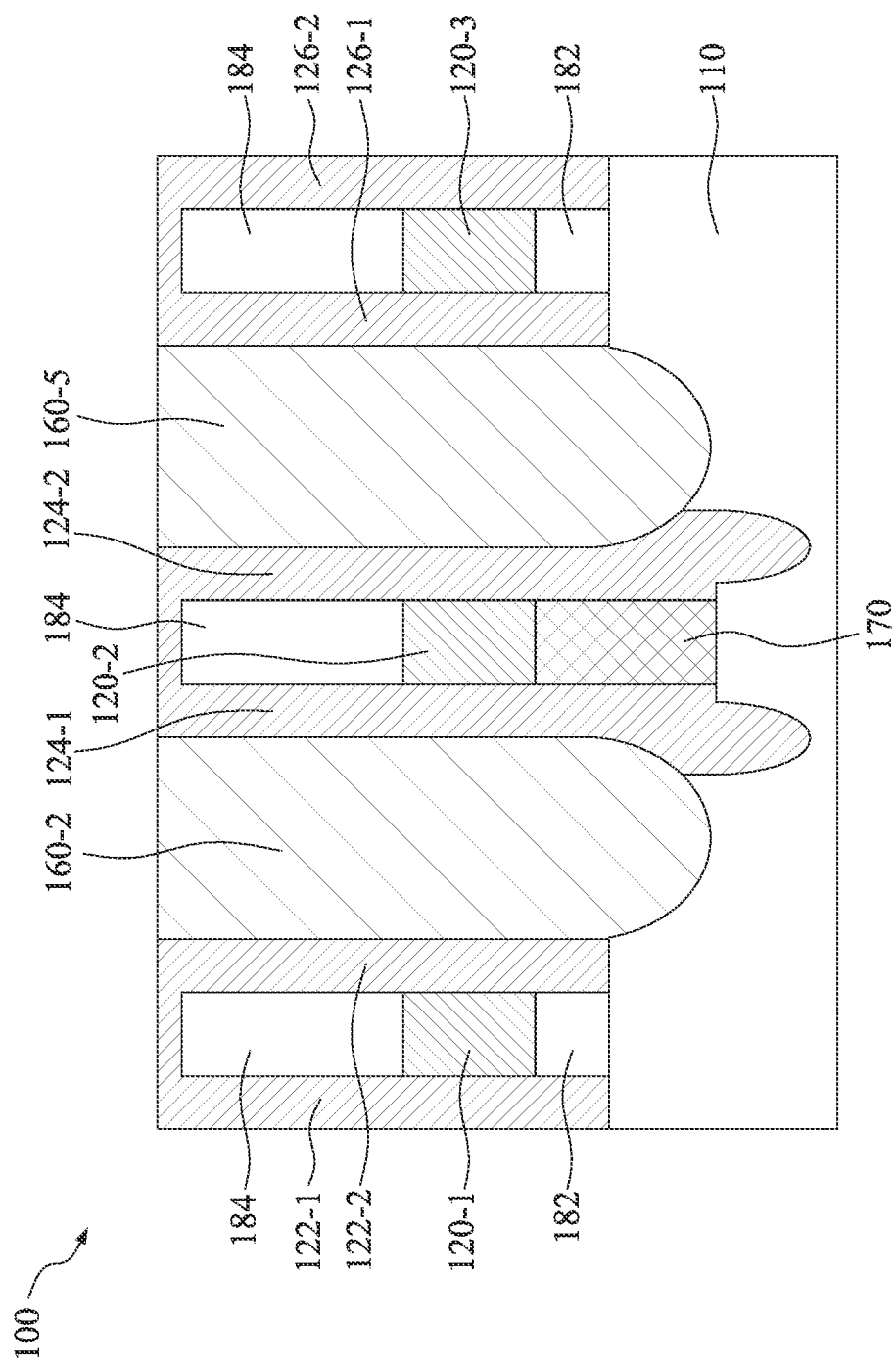
FIG. 3A is a cross-sectional view along line A-A' of the semiconductor device structure as shown in FIG. 1, in accordance with some embodiments of the present disclosure.
Figure 3B:
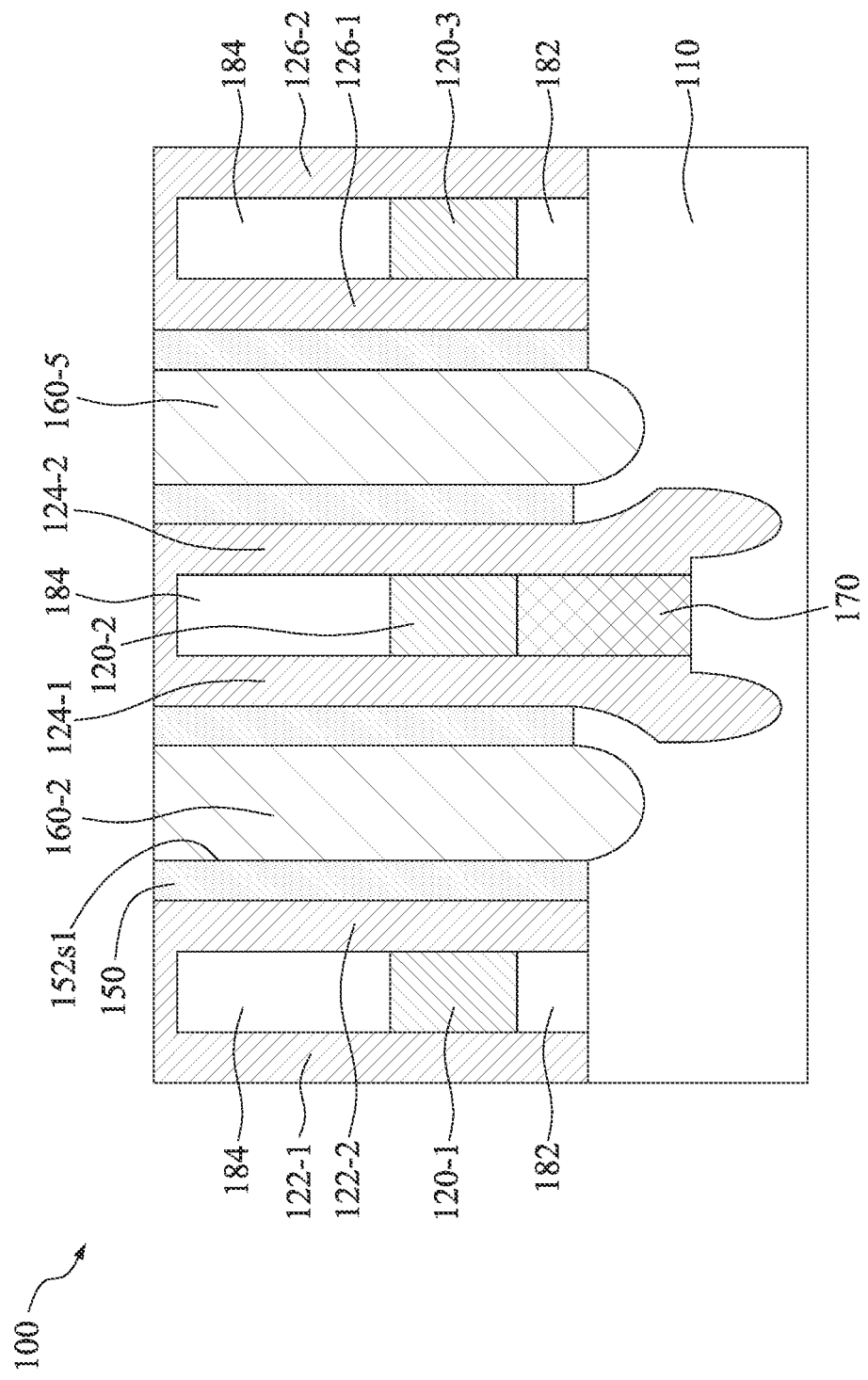
FIG. 3B is a cross-sectional view along line B-B' of the semiconductor device structure as shown in FIG. 1, in accordance with some embodiments of the present disclosure.
Figure 3C:
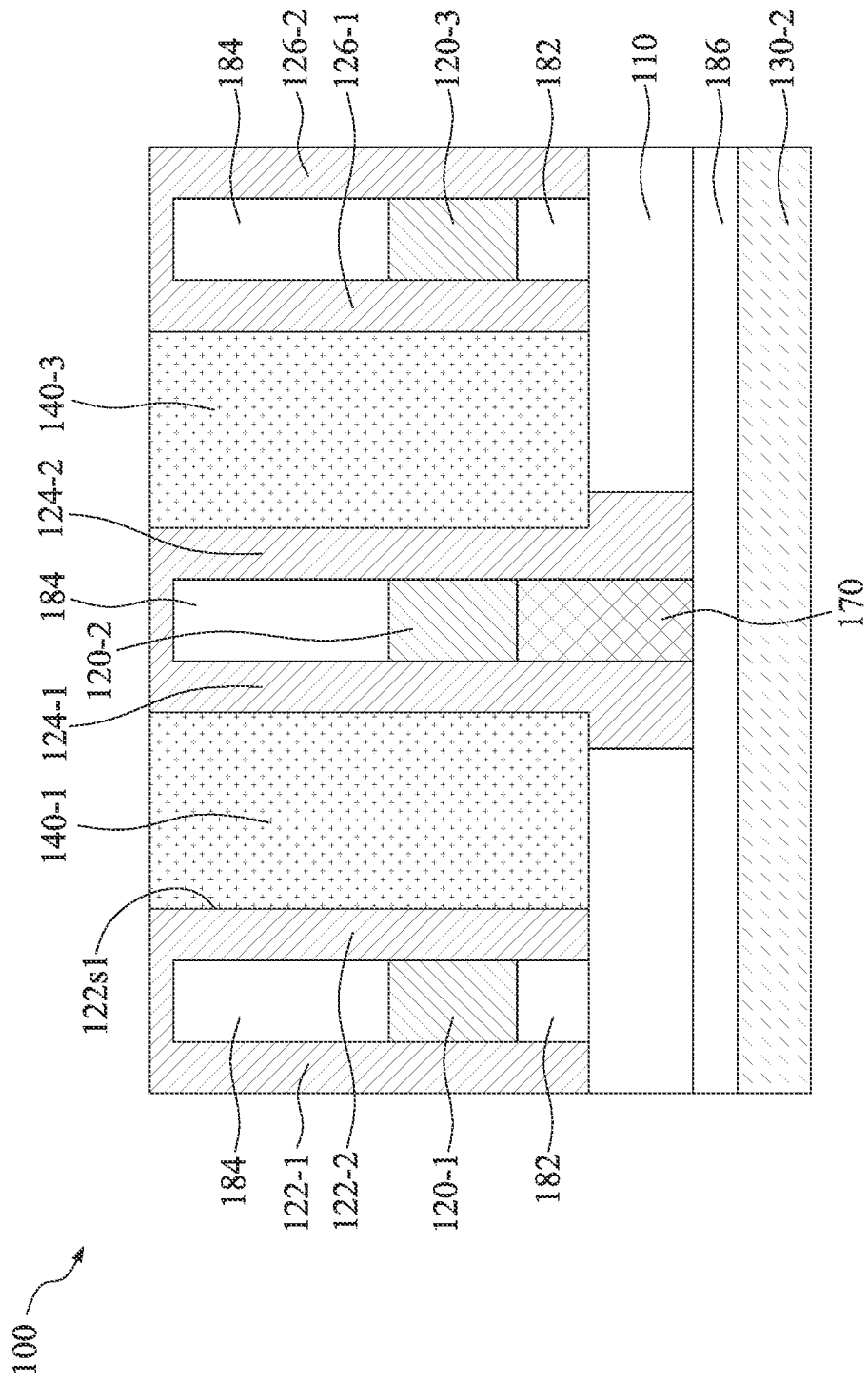
FIG. 3C is a cross-sectional view along line C-C' of the semiconductor device structure as shown in FIG. 1, in accordance with some embodiments of the present disclosure.

FIGS. 3A, 3B, and 3C are cross-sectional views along line A-A', B-B', and C-C', respectively, of the semiconductor device structure 100 as shown in FIG. 1 in accordance with some embodiments of the present disclosure.

As shown in FIG. 3A, the semiconductor device structure 100 can include a substrate 110. The substrate 110 may be a semiconductor substrate, such as a bulk semiconductor, a semiconductor-on-insulator (SOI) substrate, or the like. The substrate 110 can include an elementary semiconductor including silicon or germanium in a single crystal form, a polycrystalline form, or an amorphous form; a compound semiconductor material including at least one of silicon carbide, gallium arsenide, gallium phosphide, indium phosphide, indium arsenide, and indium antimonide; an alloy semiconductor material including at least one of SiGe, GaAsP, AlInAs, AlGaAs, GaInAs, GaInP, and GaInAsP; any other suitable material; or a combination thereof. In some embodiments, the alloy semiconductor substrate may include a SiGe alloy with a gradient Ge feature in which the Si and Ge composition changes from one ratio at one location to another ratio at another location of the gradient SiGe feature. In another embodiment, the SiGe alloy is formed over a silicon substrate. In some embodiments, a SiGe alloy can be mechanically strained by another material in contact with the SiGe alloy. In some embodiments, the substrate 110 may have a multilayer structure, or the substrate 110 may include a multilayer compound semiconductor structure. In some embodiments, p type and/or n type dopants can be doped in the substrate 110. In some embodiments, p type dopants include boron (B), other group III elements, or any combination thereof. In some embodiments, n type dopants include arsenic (As), phosphorus (P), other group V elements, or any combination thereof.

Although not shown in FIG. 3A, it should be noted that the substrate 110 can include isolation structures disposed therein. The isolation structures can include shallow trench isolation (STI), a field oxide (FOX), a local-oxidation of silicon (LOCOS) feature, and/or other suitable isolation elements. The isolation structure can include a dielectric material such as silicon oxide, silicon nitride, silicon oxynitride, fluoride-doped silicate (FSG), a low-k dielectric material, combinations thereof, and/or other suitable materials. In some embodiments, the contact features 160-2 and 160-5 can be in contact with both the silicon substrate (or an active region) and the isolation structures of the substrate 110.

The metallization line 120-2 can disposed on or over the substrate 110 and can be spaced apart from the substrate 110 by a gate structure (e.g., 170). The metallization lines 120-2 can include conductive materials, such as tungsten copper, aluminum, tantalum, tantalum nitride (TaN), titanium, titanium nitride (TiN), the like, and/or a combination thereof.

The semiconductor device structure 100 can include a gate structure 170. The gate structure 170 can be disposed on the substrate 110. The gate structure 170 can be disposed between the metallization line (e.g., 120-2) and the substrate 110. In some embodiments, a portion of the gate structure 170 can be located at an elevation lower than an upper surface of the substrate 110. The gate structure 170 can include a gate dielectric layer and a gate electrode layer.

In some embodiments, the gate dielectric layer can include silicon oxide ($SiO_x$), silicon nitride ($Si_xN_y$) silicon oxynitride (SiON), or a combination thereof. In some embodiments, the gate dielectric layer can include dielectric material(s), such as high-k dielectric material. The high-k dielectric material may have a dielectric constant (k value) greater than 4. The high-k material may include hafnium oxide ($HfO_2$), zirconium oxide ($ZrO_2$), lanthanum oxide ($La_2O_3$), yttrium oxide ($Y_2O_3$), aluminum oxide ($Al_2O_3$), titanium oxide ($TiO_2$) or another applicable material. Other suitable materials are within the contemplated scope of this disclosure.

In some embodiments, the gate electrode layer can include a polysilicon layer. In some embodiments, the gate electrode layer can be made of a conductive material, such as aluminum (Al), copper (Cu), tungsten (W), titanium (Ti), tantalum (Ta), or other applicable materials. In some embodiments, the gate electrode layer can include a work function layer. The work function layer is made of a metal material, and the metal material may include N-work-function metal or P-work-function metal. The N-work-function metal includes tungsten (W), copper (Cu), titanium (Ti), silver (Ag), aluminum (Al), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr) or a combination thereof. The P-work-function metal includes titanium nitride (TiN), tungsten nitride (WN), tantalum nitride (TaN), ruthenium (Ru) or a combination thereof. Other suitable materials are within the contemplated scope of the disclosure. The gate electrode layer can be formed by low-pressure chemical vapor deposition (LPCVD) and plasma-enhanced CVD (PECVD).

The dielectric layer 182 can be disposed between the metallization line (e.g., 120-1 or 120-3) and the substrate 110. The dielectric layer 182 can include dielectric materials. For example, the dielectric layer 182 can include SiN, $SiO_2$, silicon oxynitride (SiON), silicon carbon nitride (SiCN), silicon carbide (SiC), aluminum oxide ($Al_2O_3$), halium oxide ($HfO_2$), or lanthanum oxide ($La_2O_3$).

In some embodiments, the semiconductor device structure 100 can include a dielectric layer 184. The dielectric layer 184 can be disposed on or over the metallization line (e.g., 120-1, 120-2 or 120-3). The dielectric layer 184 can include dielectric materials. For example, the dielectric layer 184 can include SiN, $SiO_2$, silicon oxynitride (SiON), silicon carbon nitride (SiCN), silicon carbide (SiC), aluminum oxide ($Al_2O_3$), hafnium oxide ($HfO_2$), or lanthanum oxide ($La_2O_3$).

The spacer (e.g., 122-1) can be formed on a sidewall of the dielectric layer 182, the metallization lines 120-1, and the dielectric layer 184. The spacer (e.g., 124-1) can be formed on a sidewall of the dielectric layer 184, the metallization lines 120-2, and the gate structure 170. In some embodiments, a portion of the spacer (e.g., 124-1) can be lower than an upper surface of the substrate 110. In some embodiments, the spacer (e.g., 122-1, 122-2, 124-1, 124-2, 126-1, and 126-2) can include multi-layers. In some embodiments, the spacer (e.g., 122-1, 122-2, 124-1, 124-2, 126-1, and 126-2) can include silicon oxide ($SiO_x$), silicon nitride ($Si_xN_y$), silicon oxynitride (SiON), or a combination thereof. In some embodiments, the spacer (e.g., 122-1, 122-2, 124-1, 124-2, 126-1, and 126-2) can include an air gap. For example, the air gap can be sandwiched between two silicon nitride layers.

The contact feature (e.g., 160-2 or 160-5) can be disposed on the substrate 110. In some embodiments, a portion of the contact feature (e.g., 160-2 or 160-5) can be lower than an upper surface of the substrate 110. In some embodiments, the contact feature (e.g., 160-2 or 160-5) can be in contact with the spacer of the metallization line. For example, the contact feature 160-2 can be in contact with the spacer 122-2 of the metallization line 120-1 and the spacer 124-1 of the metallization lines 120-2.

In some embodiments, the contact feature (e.g., 160-2 or 160-5) can include a barrier layer (not shown) and a conductive layer (not shown) on the barrier layer. The barrier layer can include titanium, tantalum, titanium nitride, tantalum nitride, manganese nitride or a combination thereof. The conductive layer may include metal, such as tungsten (W), copper (Cu), Ru, Ir, Ni, Os, Rh, Al, Mo, Co, alloys thereof, combinations thereof or any metallic material with suitable resistance and gap-fill capability. In some embodiments, the contact feature (e.g., 160-2 or 160-5) can include a polysilicon layer.

Although not shown in FIG. 3A, it should be noted that another contact feature (e.g., a bit line contact) can penetrate the dielectric layer 184 to be electrically connected to the metallization line 120-2 so that the metallization line 120-2 can be imposed a power supply by the bit line contact.

As shown in FIG. 3B, the profile modifier 150 can be disposed on the substrate 110 and located between the spacer and the contact feature. For example, the segments 152-1 of the profile modifier 150 can be located between the spacer 122-2 and the contact feature 160-2. That is, a portion of the contact feature 160-2 can be spaced apart from the spacer 122-2 by the segments 152-1 of the profile modifier 150.

In some embodiments, the profile modifier 150 can include silicon oxide (SiO), silicon nitride ($Si_xN_y$), silicon oxynitride (SiON), or a combination thereof. In some embodiments, the material of the profile modifier 150 can be the same as or similar to the outmost layer of the spacer. In some embodiments, a portion of the contact feature (e.g., 160-2) can be in contact with the sidewall (e.g., 152s1) of the spacer (e.g., 152-1).

As shown in FIG. 3C, the metallization line (e.g., 130-2) can be spaced apart from the gate structure 170 by a dielectric layer 186. The metallization lines 130-2 can include conductive materials, such as tungsten copper, aluminum, tantalum, tantalum nitride (TaN), titanium, titanium nitride (TiN), the like, and/or a combination thereof. In some embodiments, the metallization line (e.g., 130-2) can be located lower than an upper surface of the substrate 110.

The dielectric layer 186 can include silicon oxide ($SiO_x$), silicon nitride ($Si_xN_y$), silicon oxynitride (SiON), or a combination thereof.

The isolation feature (e.g., 140-1) can be located between the metallization lines (e.g., 120-1 and 120-2). The isolation feature (e.g., 140-1) can be in contact with the sidewall (e.g., 122s1) of the spacer (e.g., 122-2). In some embodiments, the upper surface of the substrate 110, in contact with the isolation features 140-1, can be located at an elevation higher than that in contact with the contact feature 160-2, as shown in FIG. 3A and FIG. 3C.

In some embodiments, each of the segments 152-1, 152-2, 152-3, and 152-4 of the profile modifier 150 can be utilized to define the aperture R2, which can have a partial circle, a partial ellipse or a partial oval profile in a plan view. When a conductive material is filled into a rounded aperture R2 to form a contact feature, no or fewer voids can be formed therein, which can improve yields of manufacturing the semiconductor device structure 100. In a comparative example, a conductive material is filled into an opening having a profile similar to that of the aperture R1. As a result, voids may be generated at the corners of openings, having a negative influence on the electrical connection.

Figure 4:
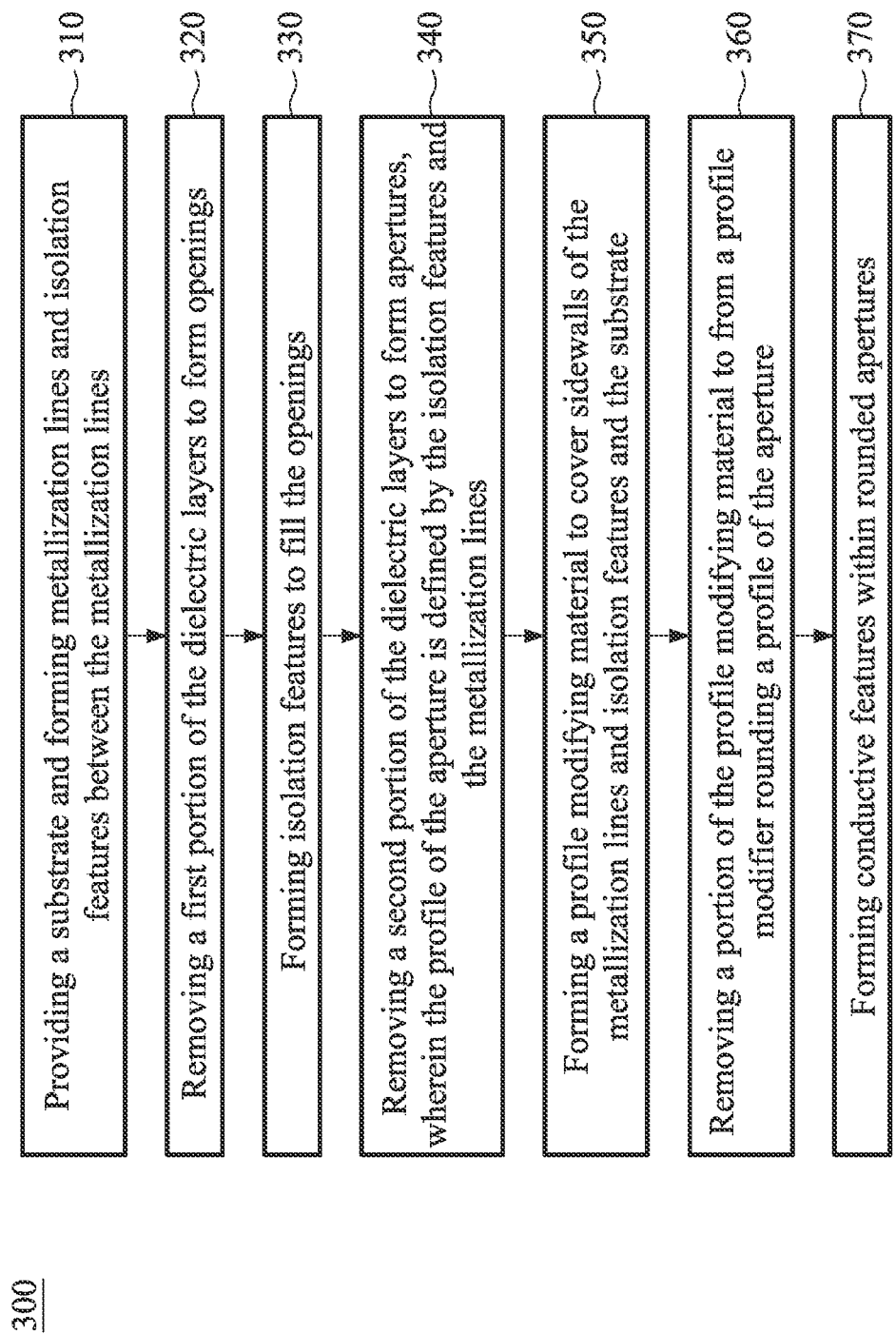
FIG. 4 is a schematic chart illustrating a method of manufacturing a semiconductor device structure, in accordance with some embodiments of the present disclosure.
Figure 5:
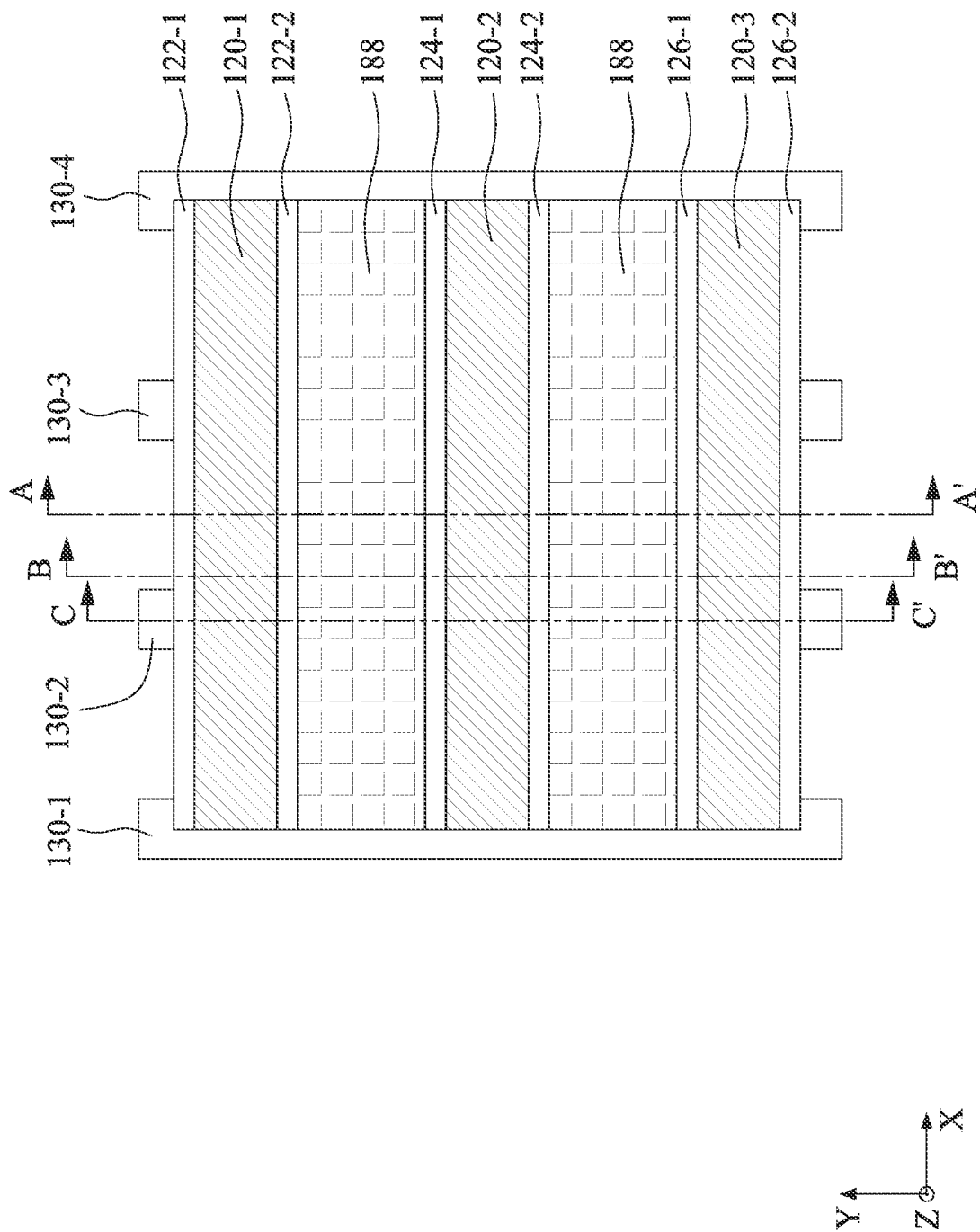
FIGS. 5, 5A, 5B, and 5C illustrate one or more stages of an example of a method for manufacturing a semiconductor package structure according to some embodiments of the present disclosure.
Figure 5A:
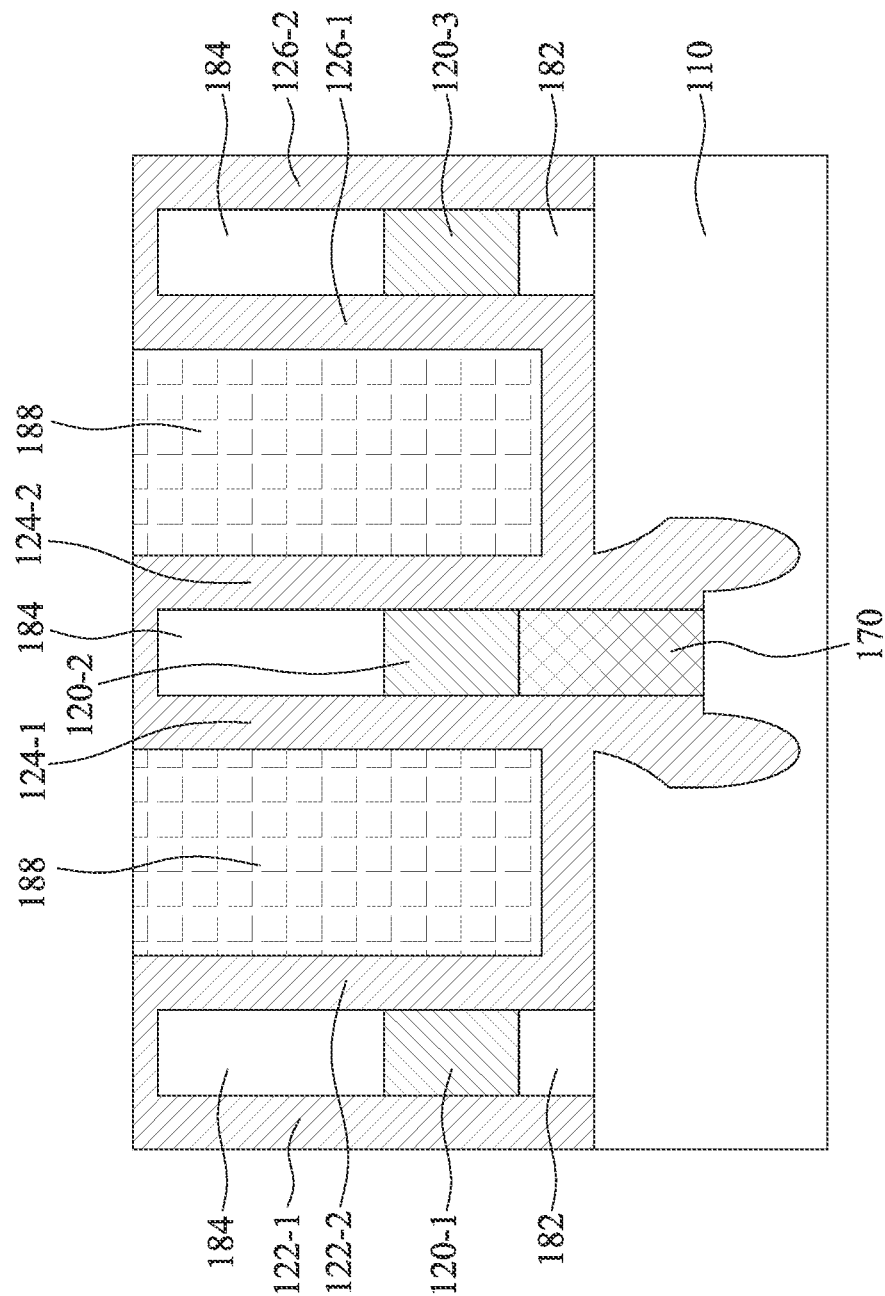
Figure 5B:
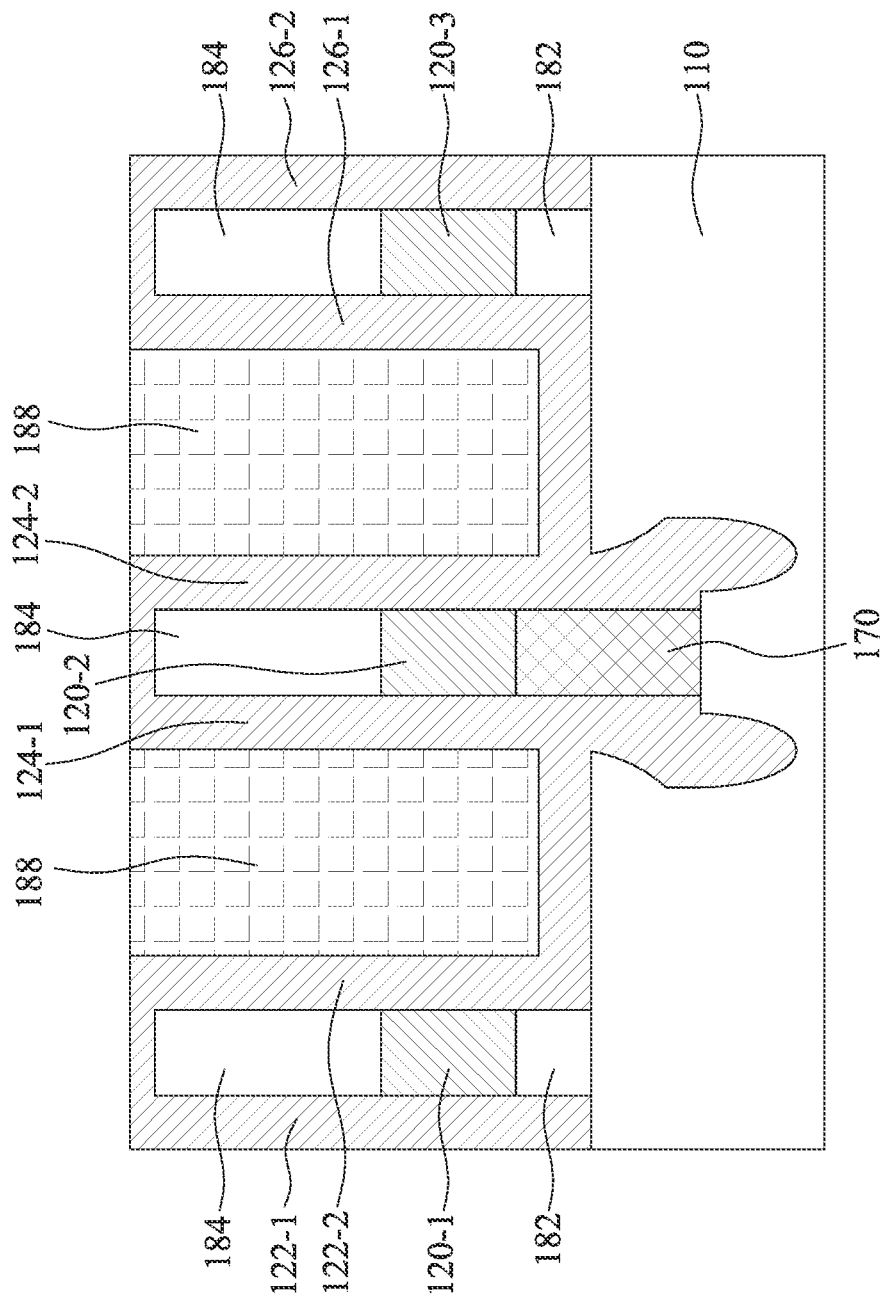
Figure 5C:
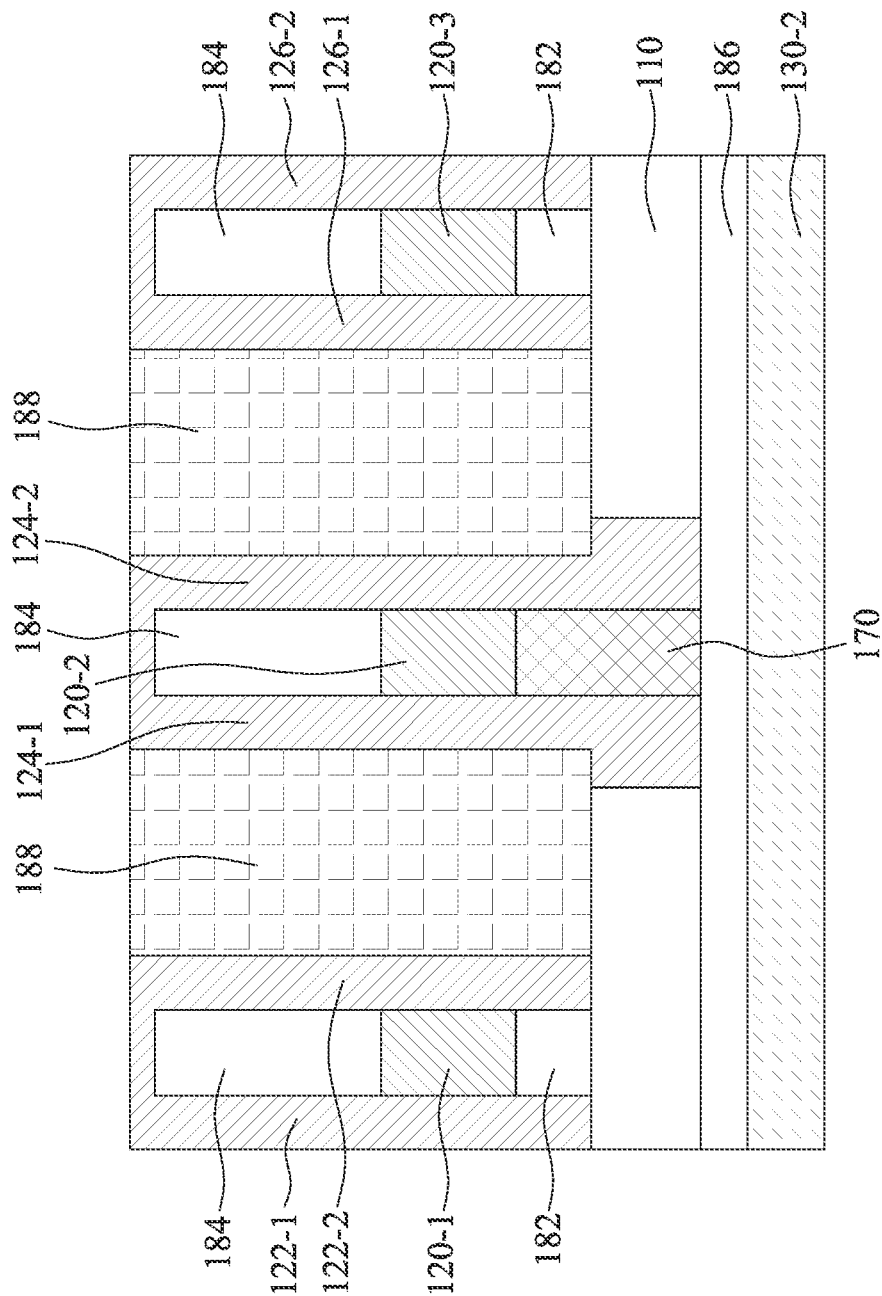
Figure 6:
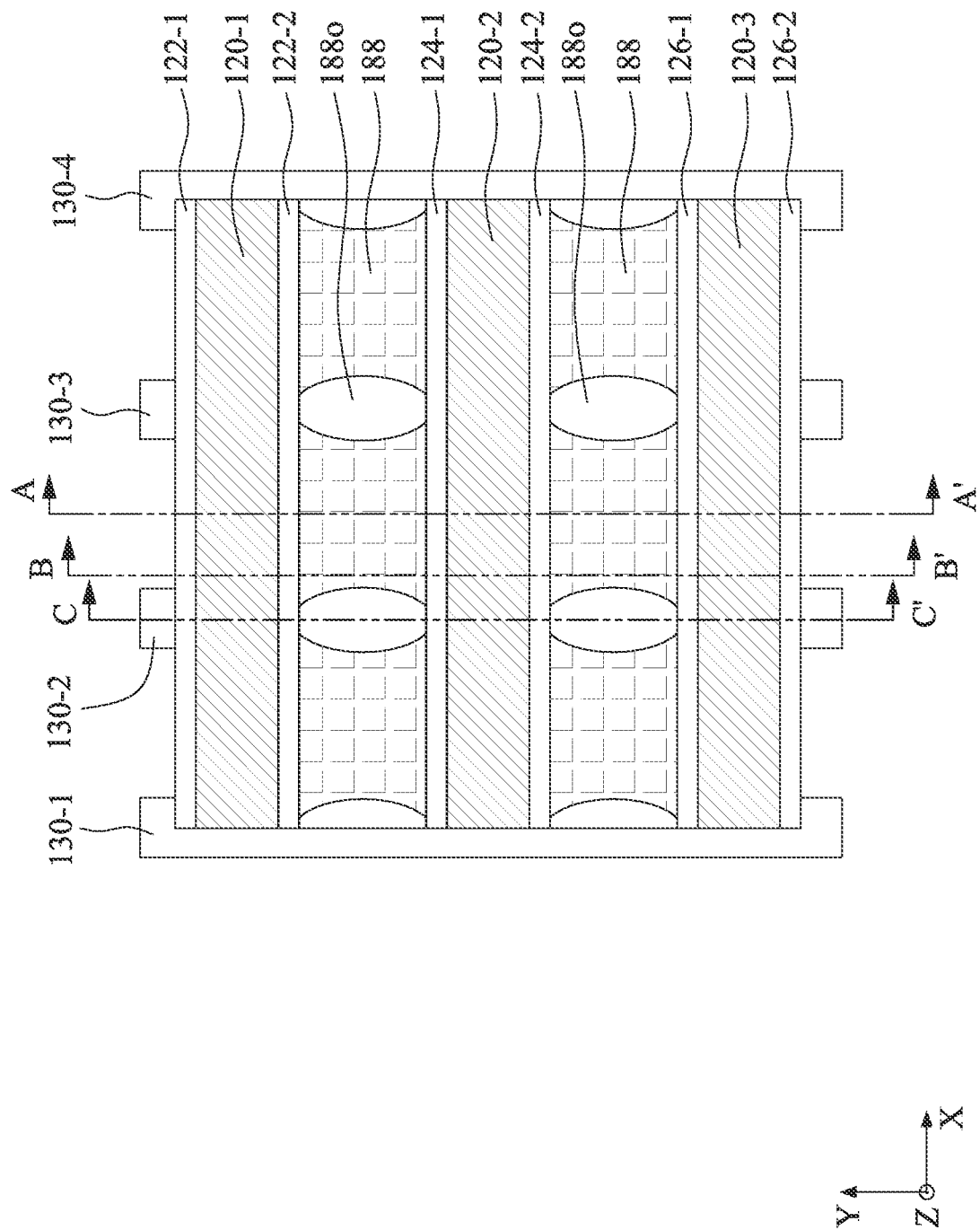
FIGS. 6, 6A, 6B, and 6C illustrate one or more stages of an example of a method for manufacturing a semiconductor package structure according to some embodiments of the present disclosure.
Figure 6A:
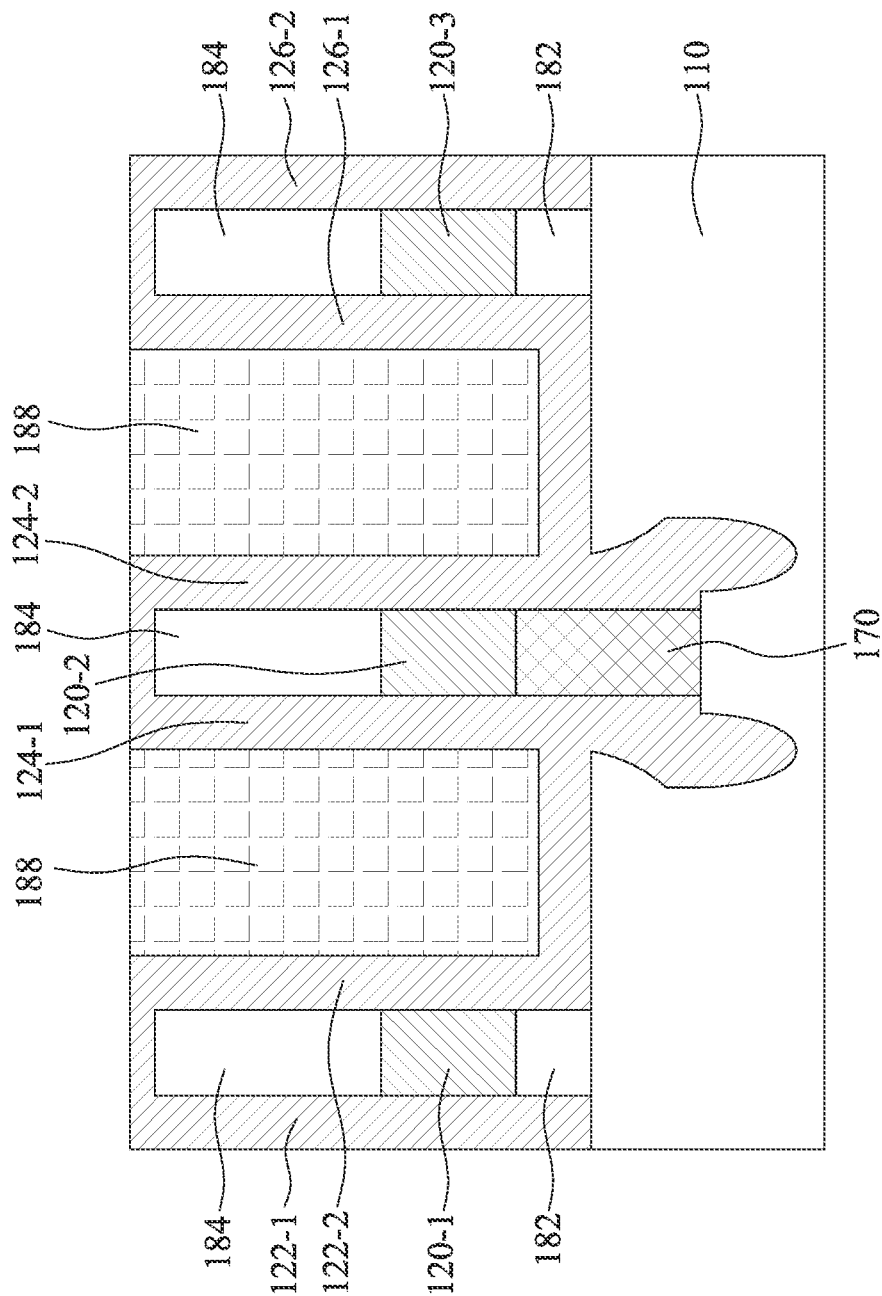
Figure 6B:
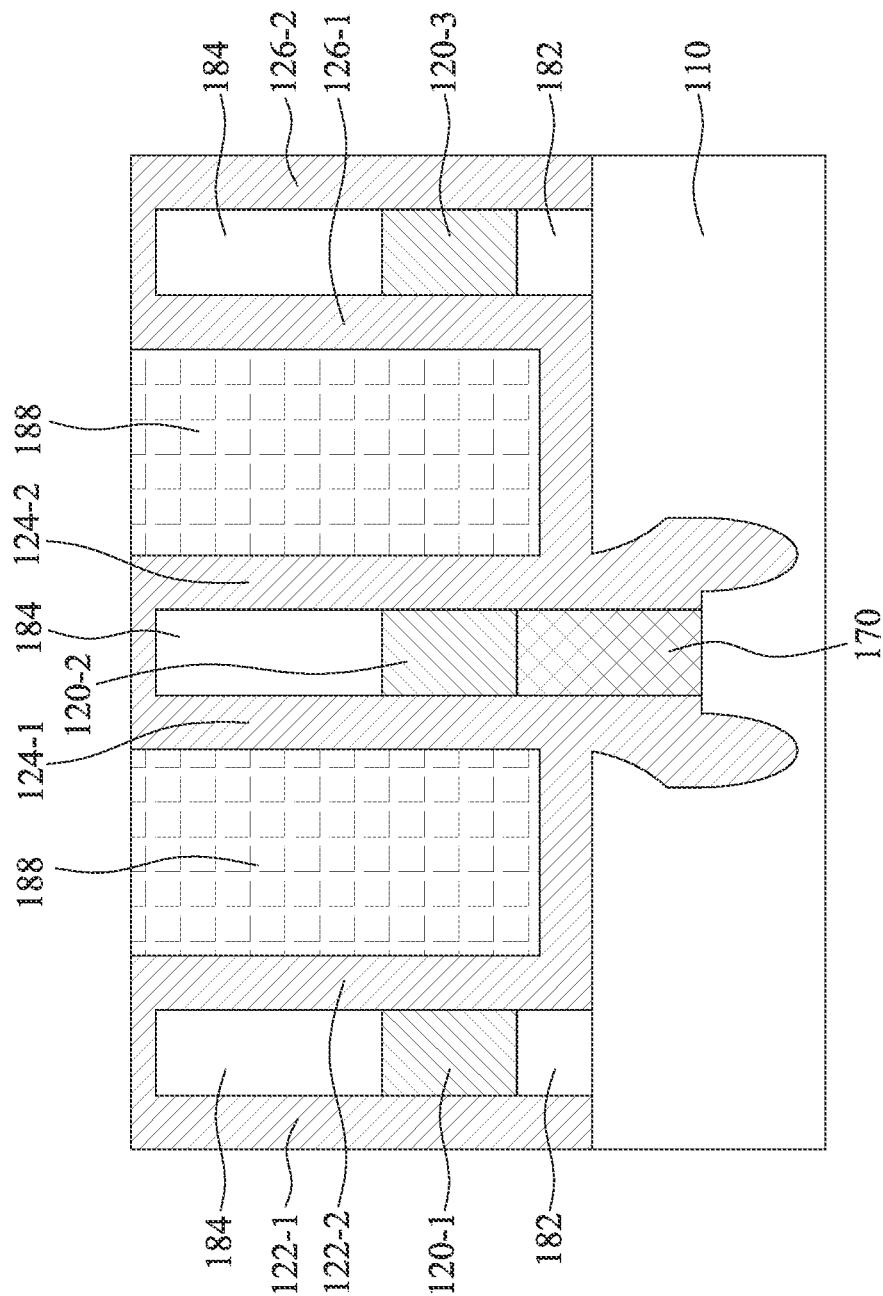
Figure 6C:
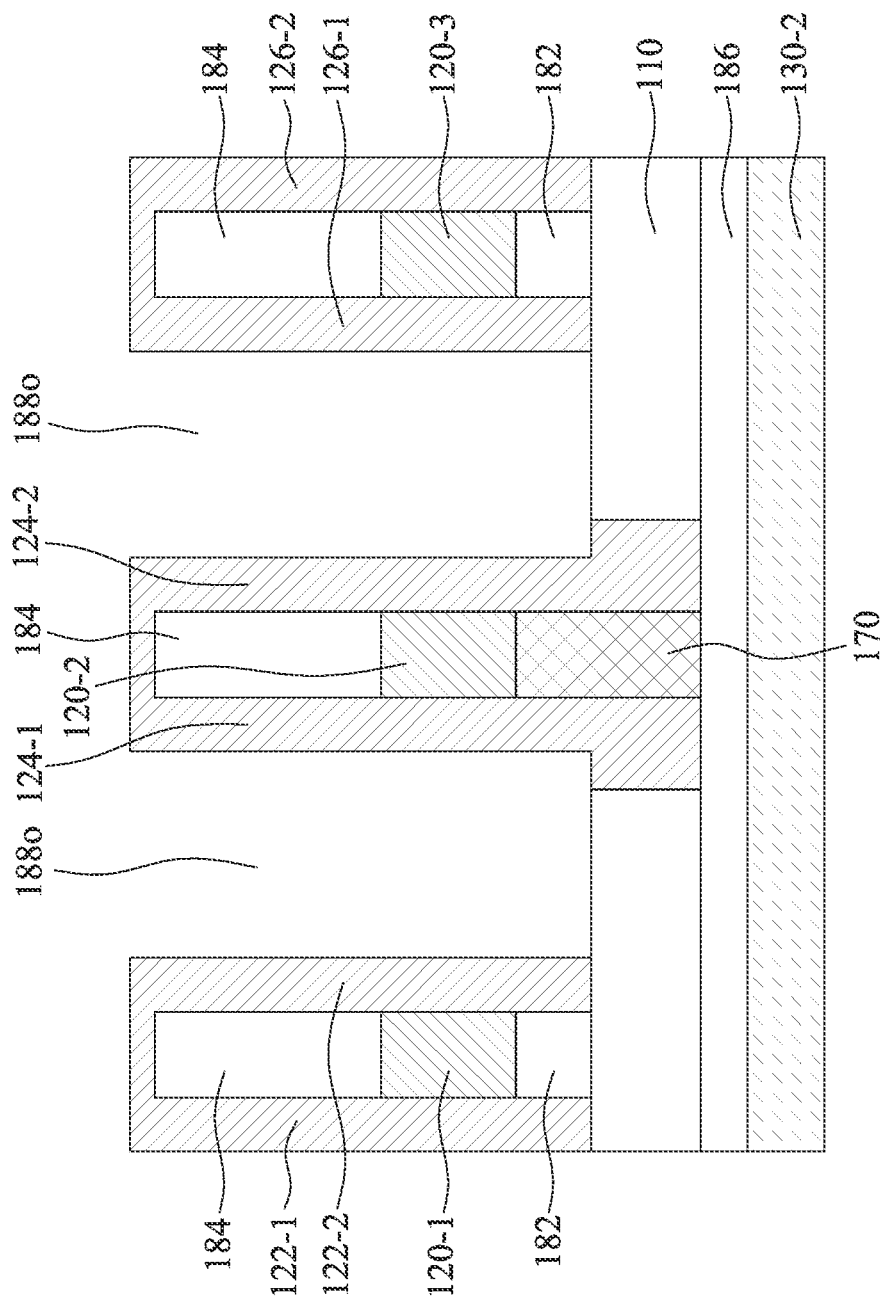
Figure 7:
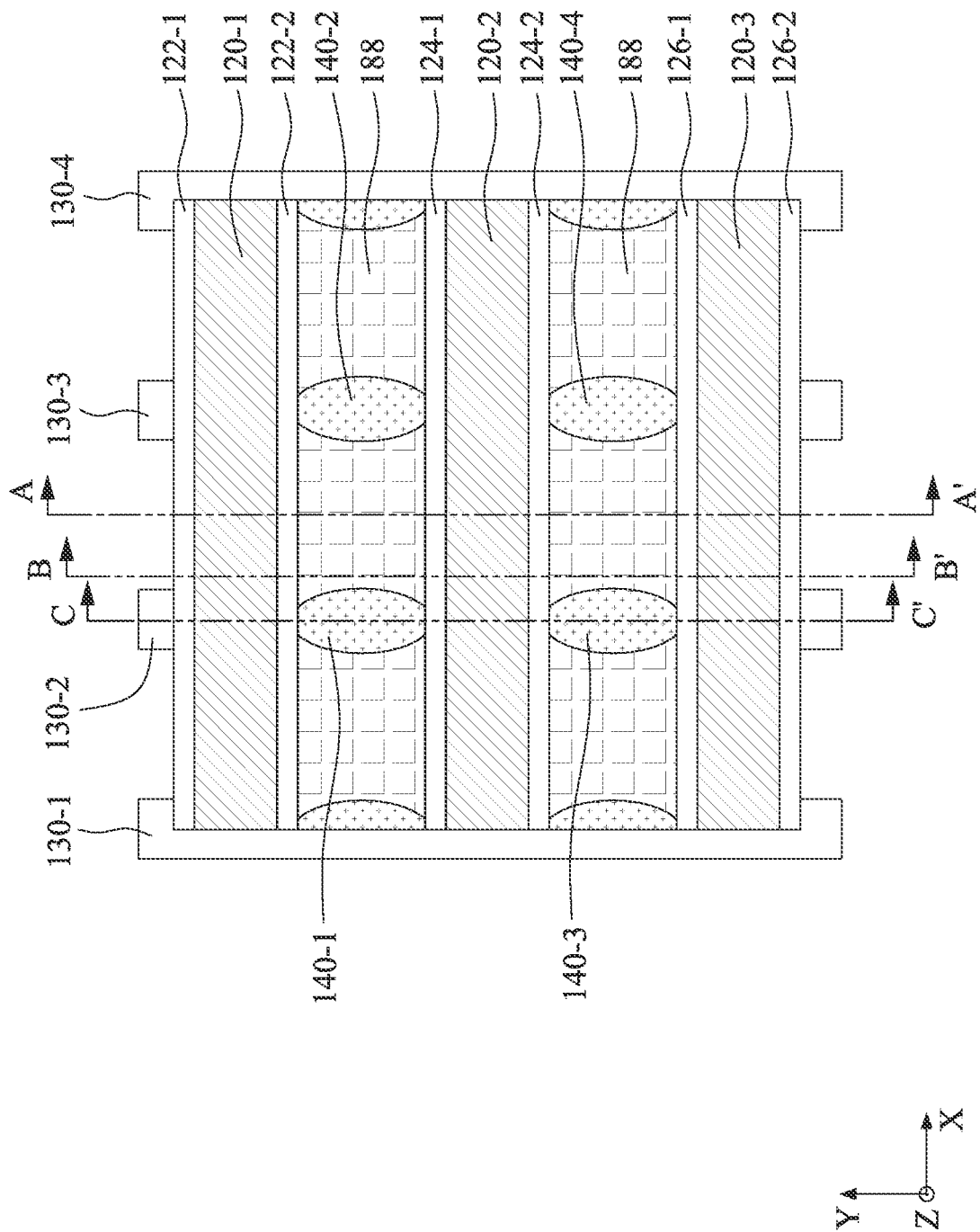
FIGS. 7, 7A, 7B, and 7C illustrate one or more stages of an example of a method for manufacturing a semiconductor package structure according to some embodiments of the present disclosure.
Figure 7A:
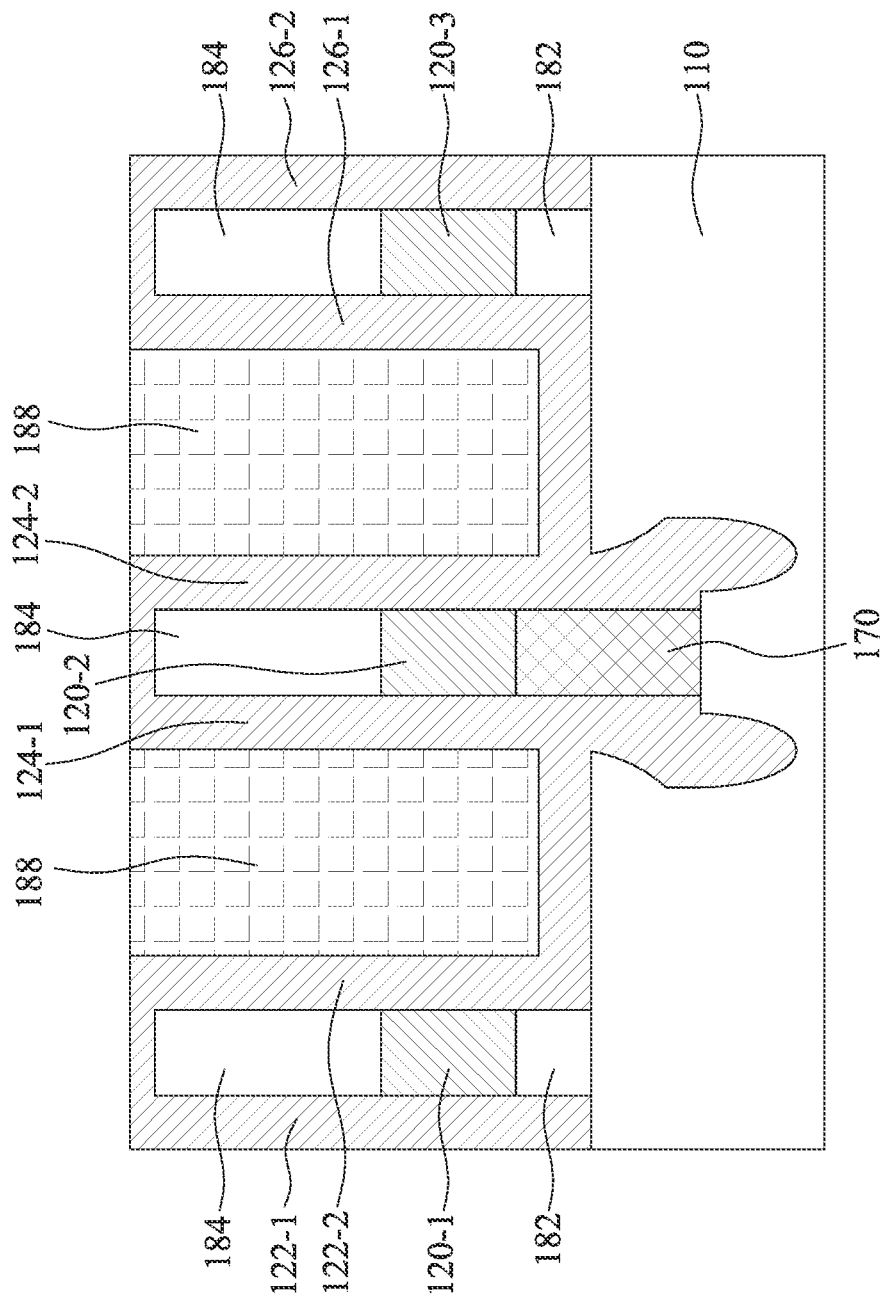
Figure 7B:
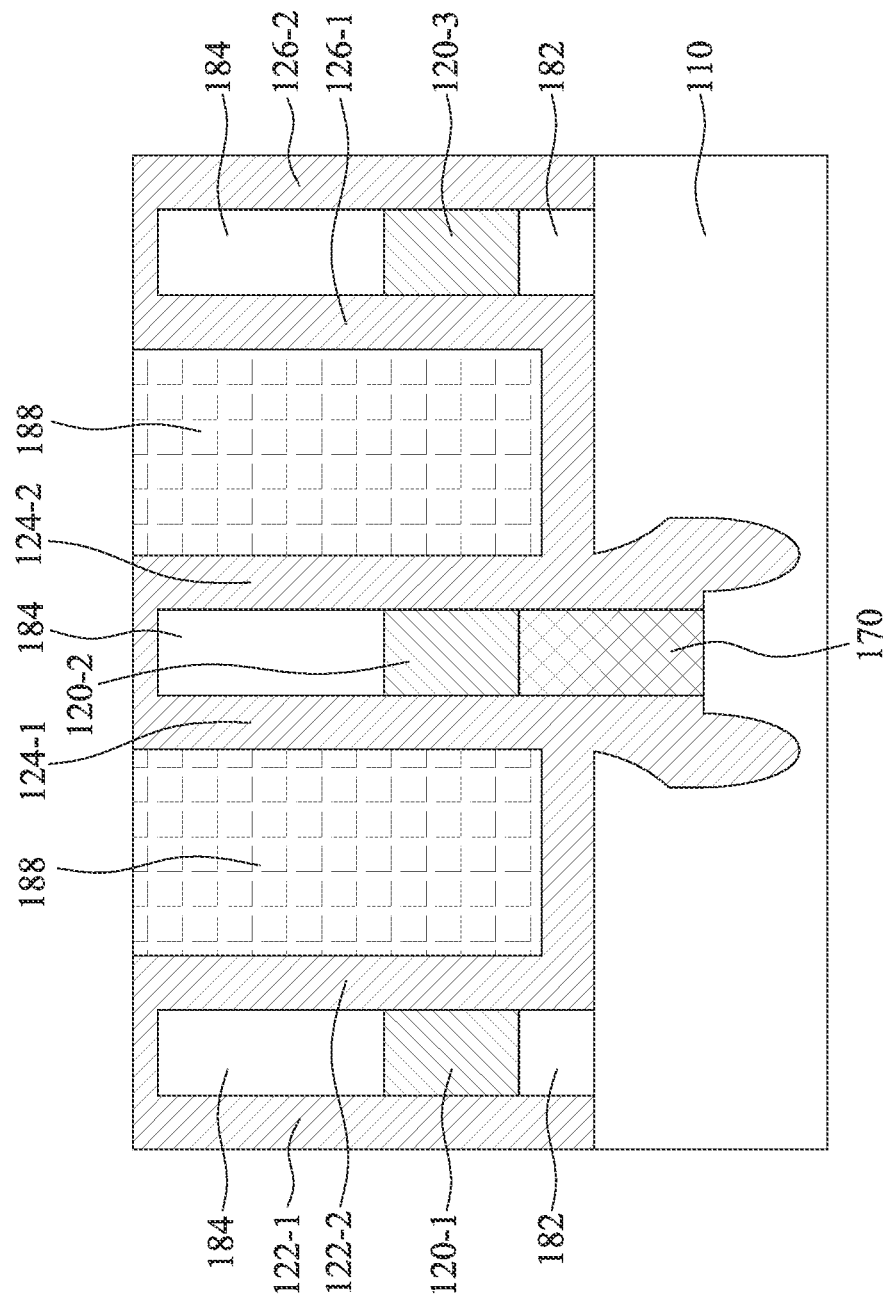
Figure 7C:
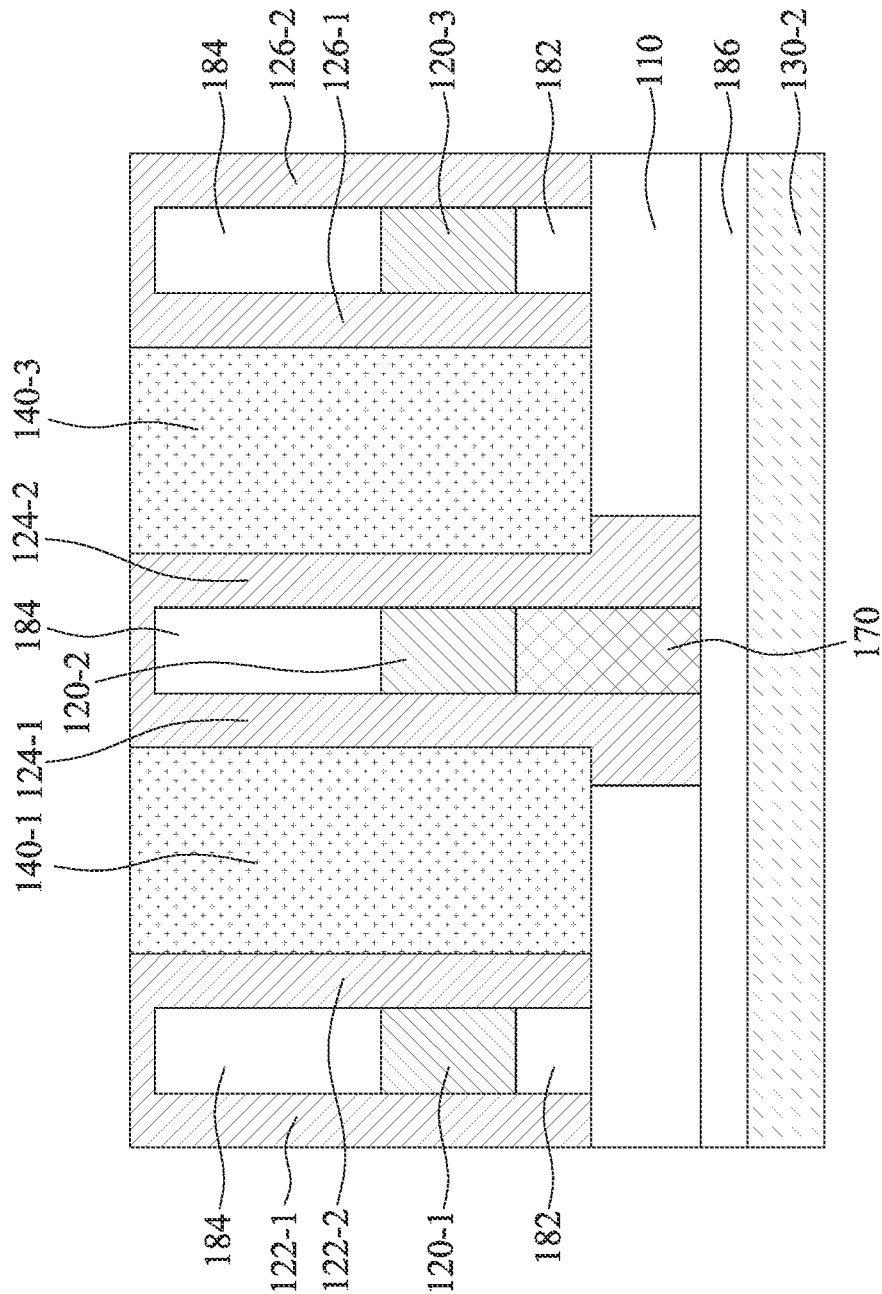
Figure 8:
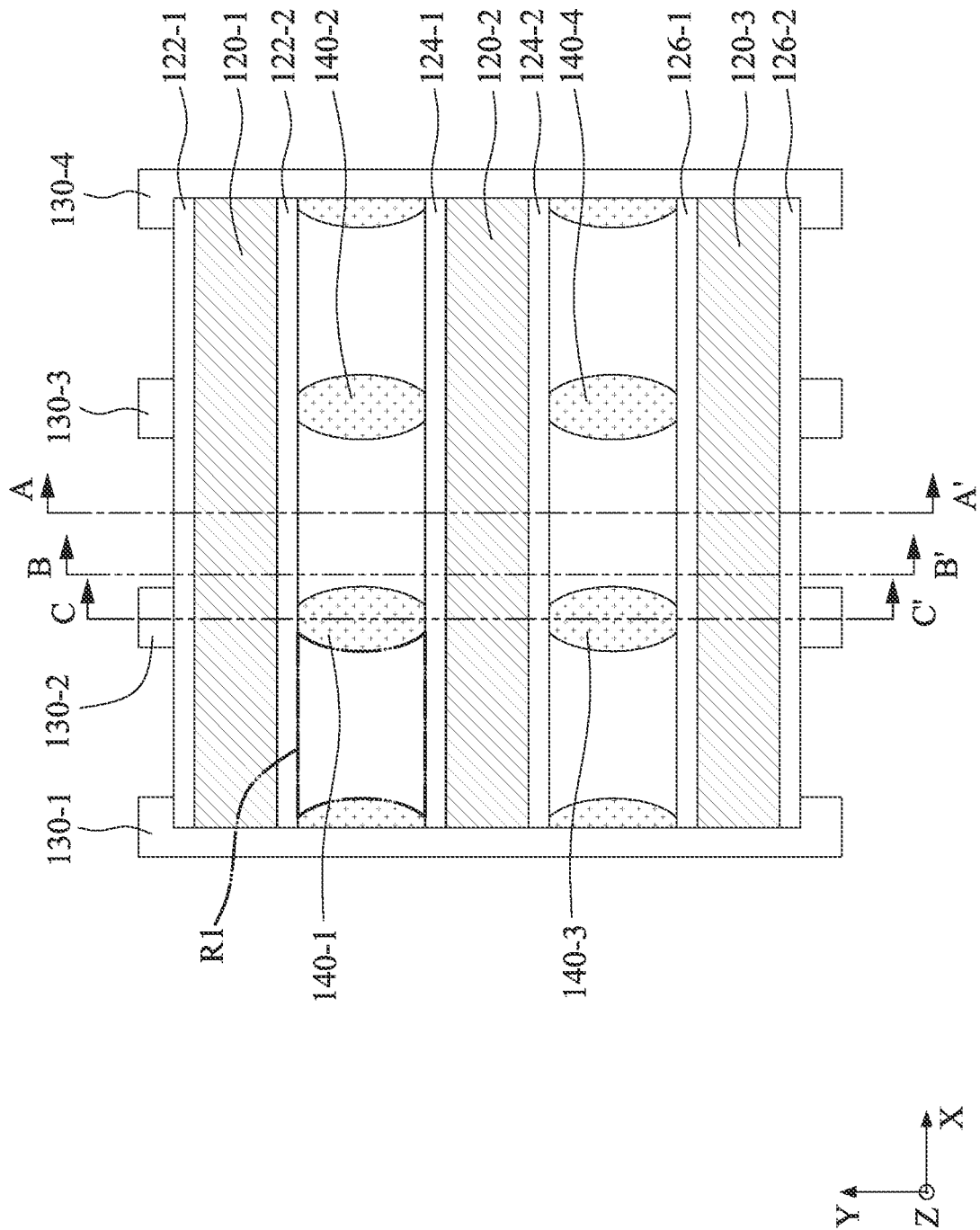
FIGS. 8, 8A, 8B, and 8C illustrate one or more stages of an example of a method for manufacturing a semiconductor package structure according to some embodiments of the present disclosure.
Figure 8A:
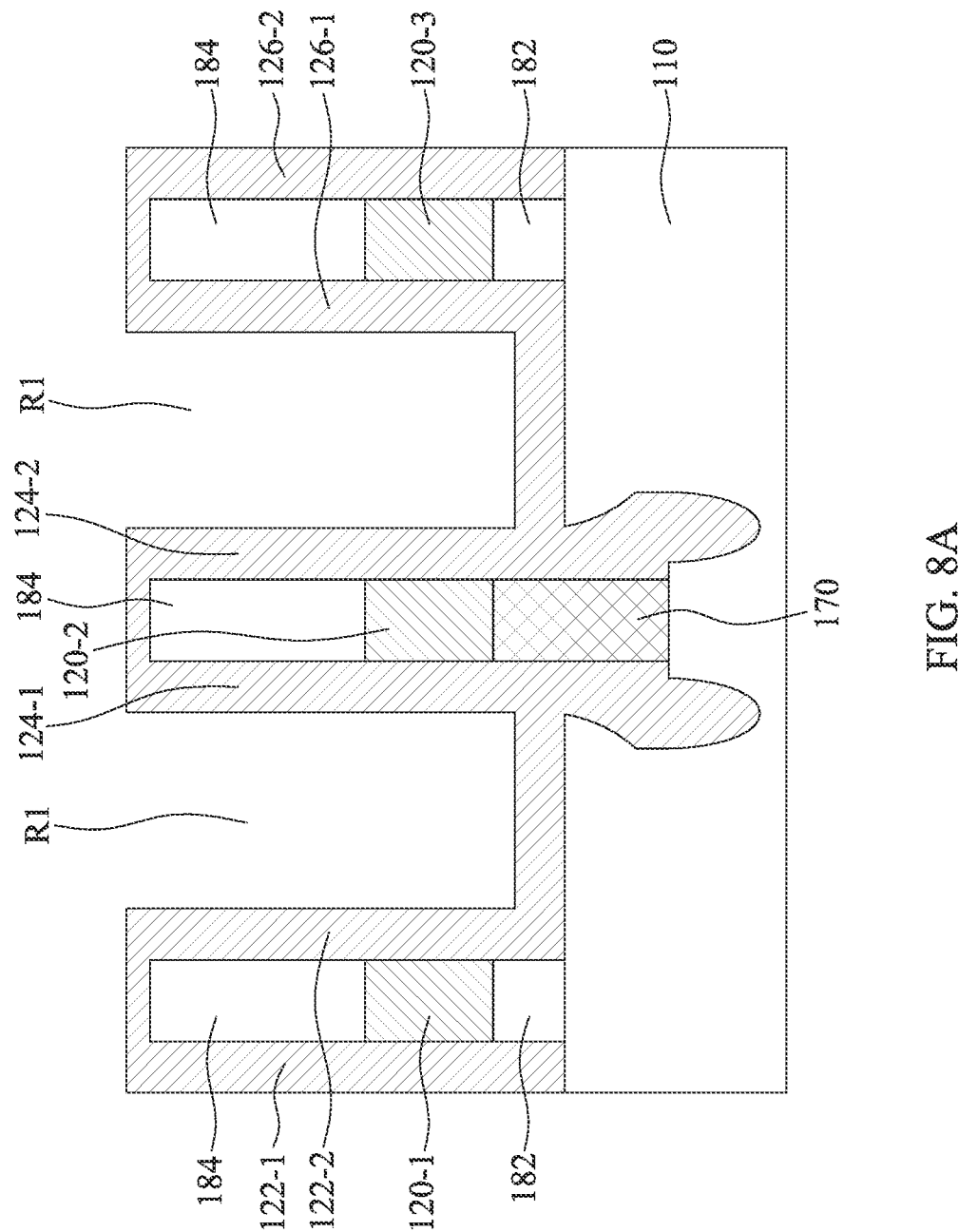
Figure 8B:
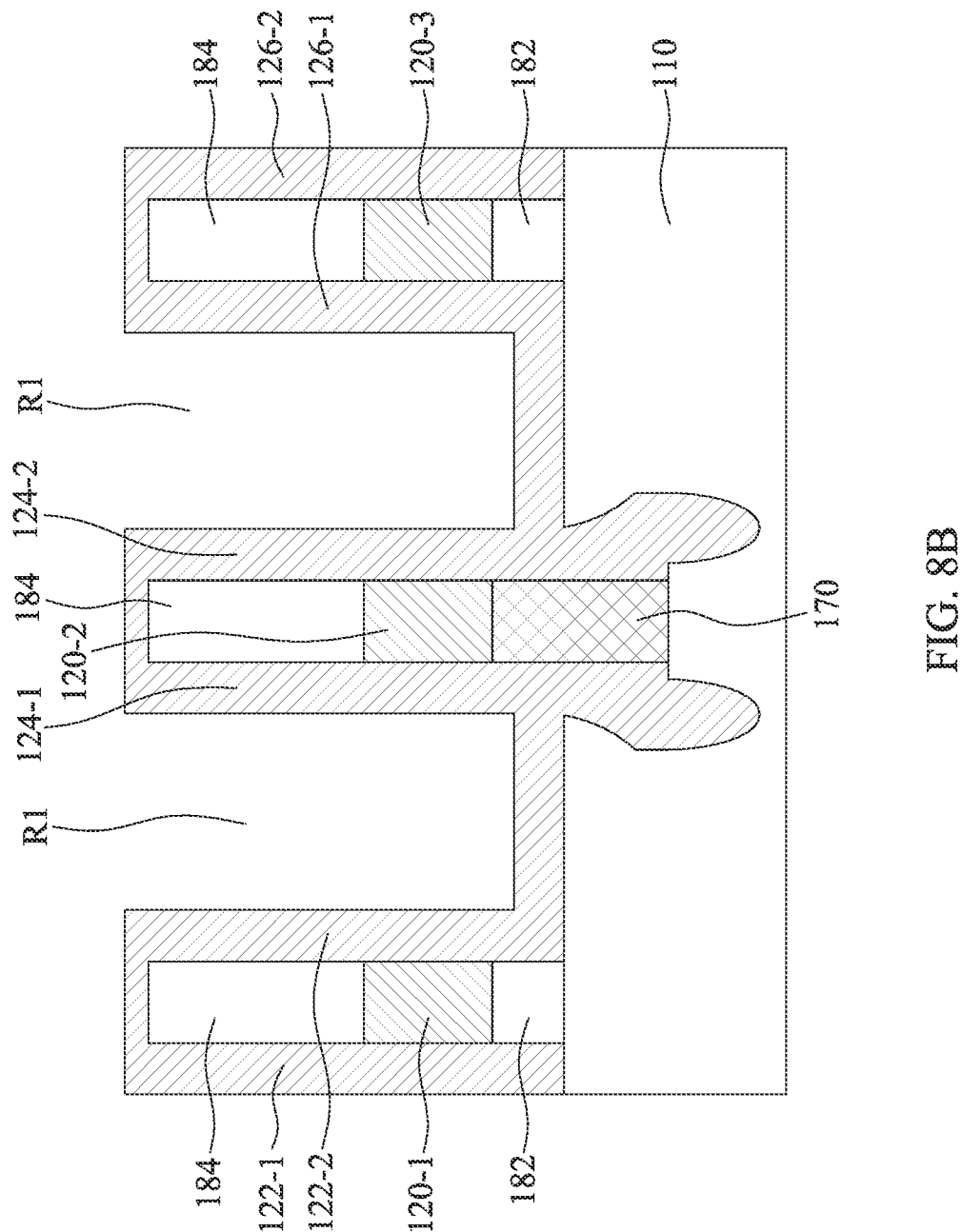
Figure 8C:
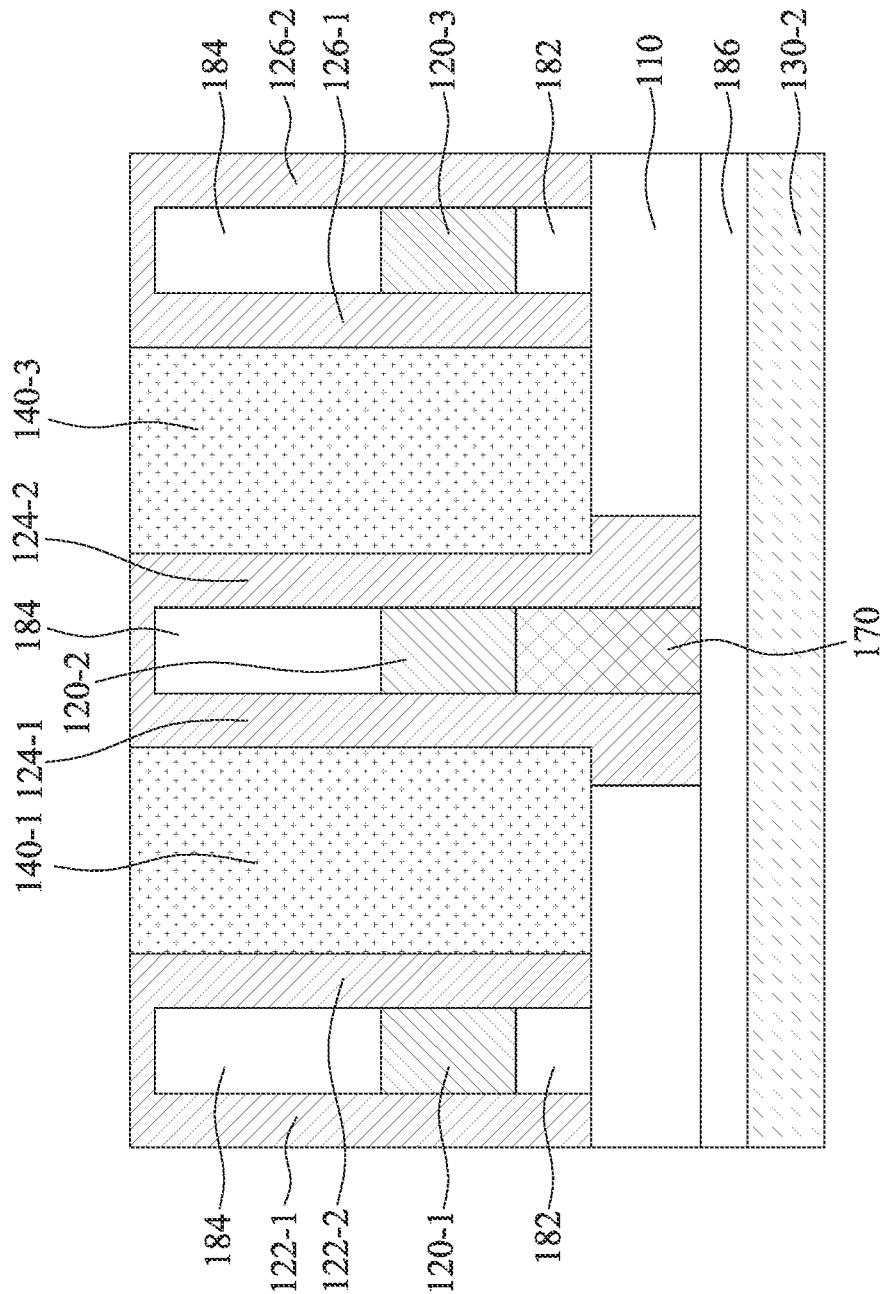
Figure 9:
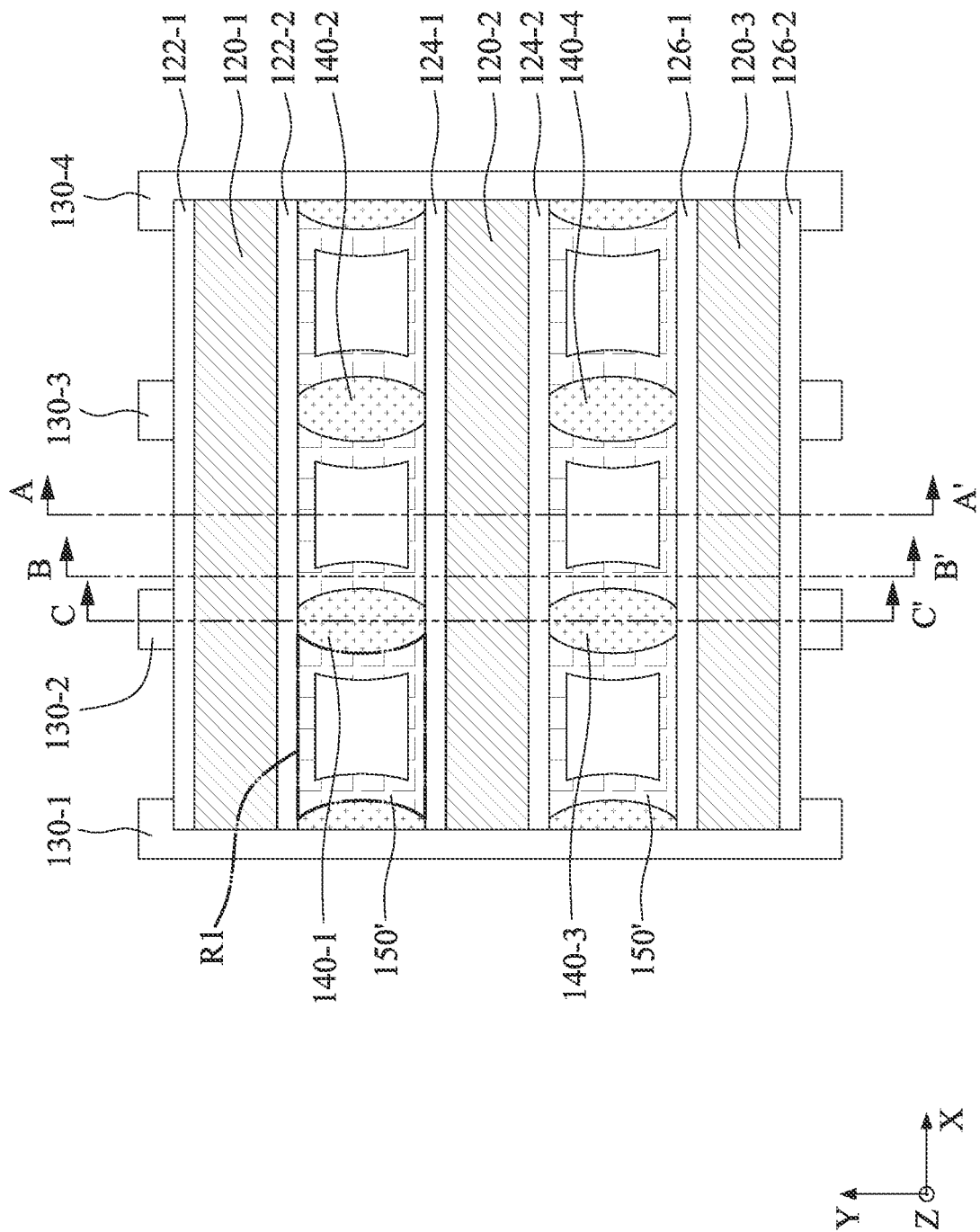
FIGS. 9, 9A, 9B, and 9C illustrate one or more stages of an example of a method for manufacturing a semiconductor package structure according to some embodiments of the present disclosure.
Figure 9A:
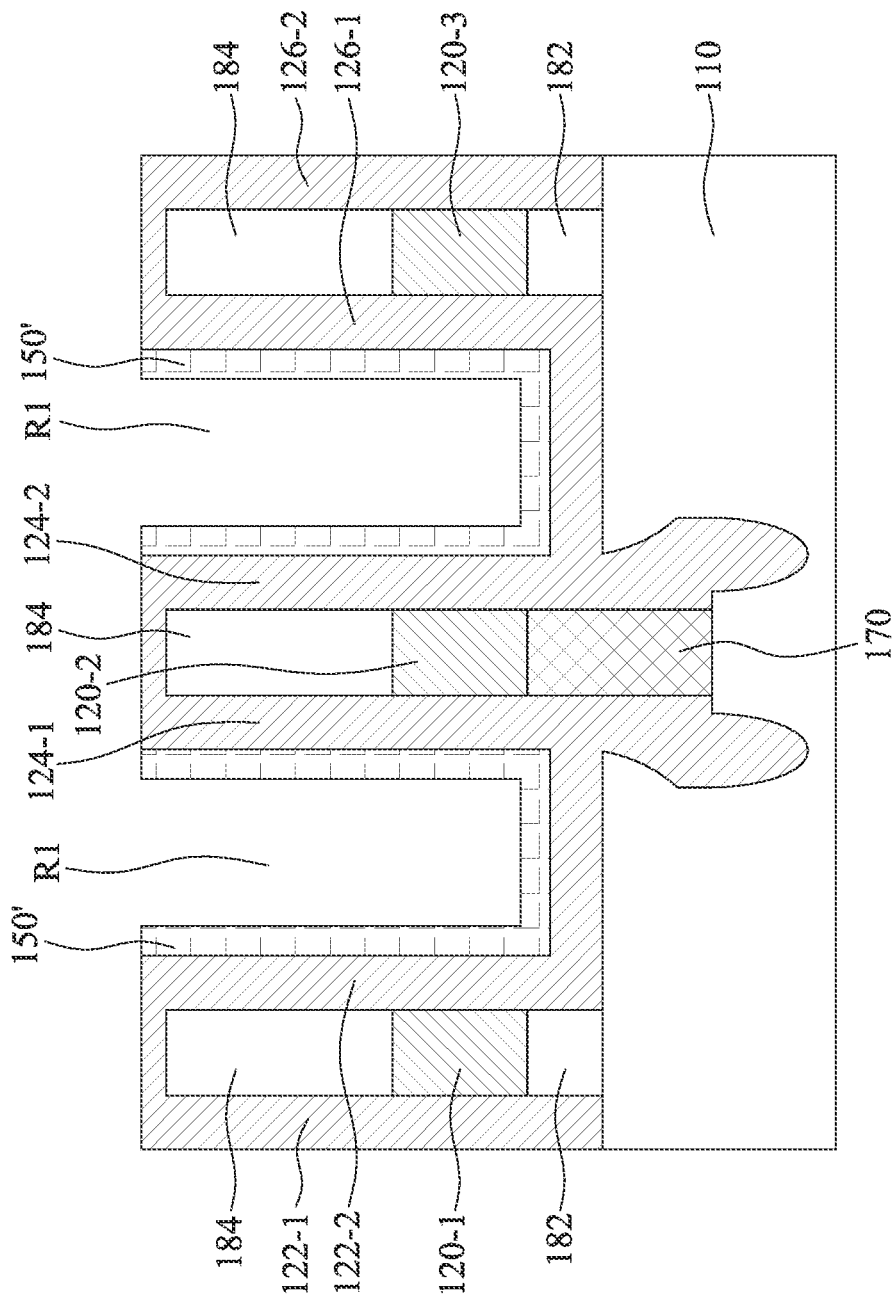
Figure 9B:
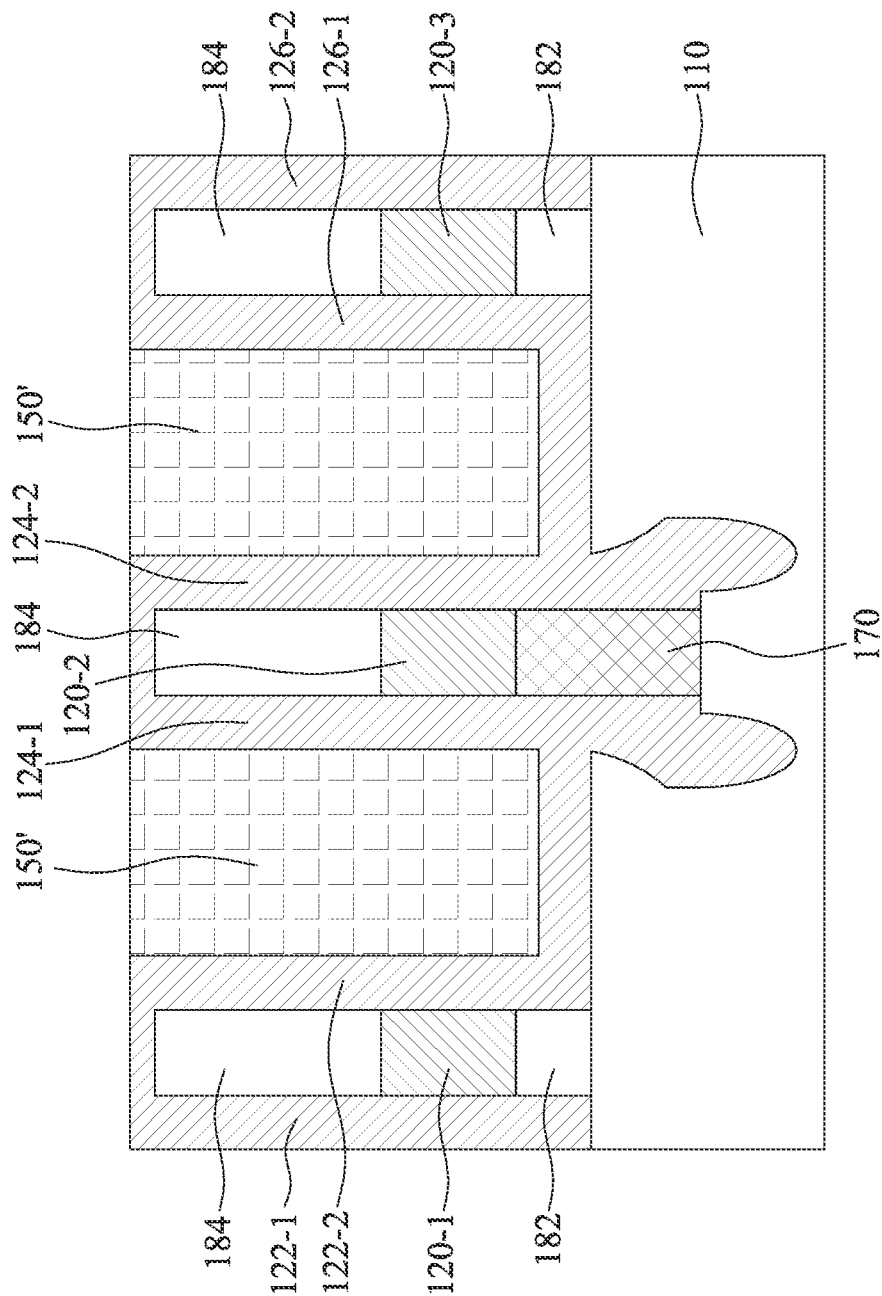
Figure 9C:
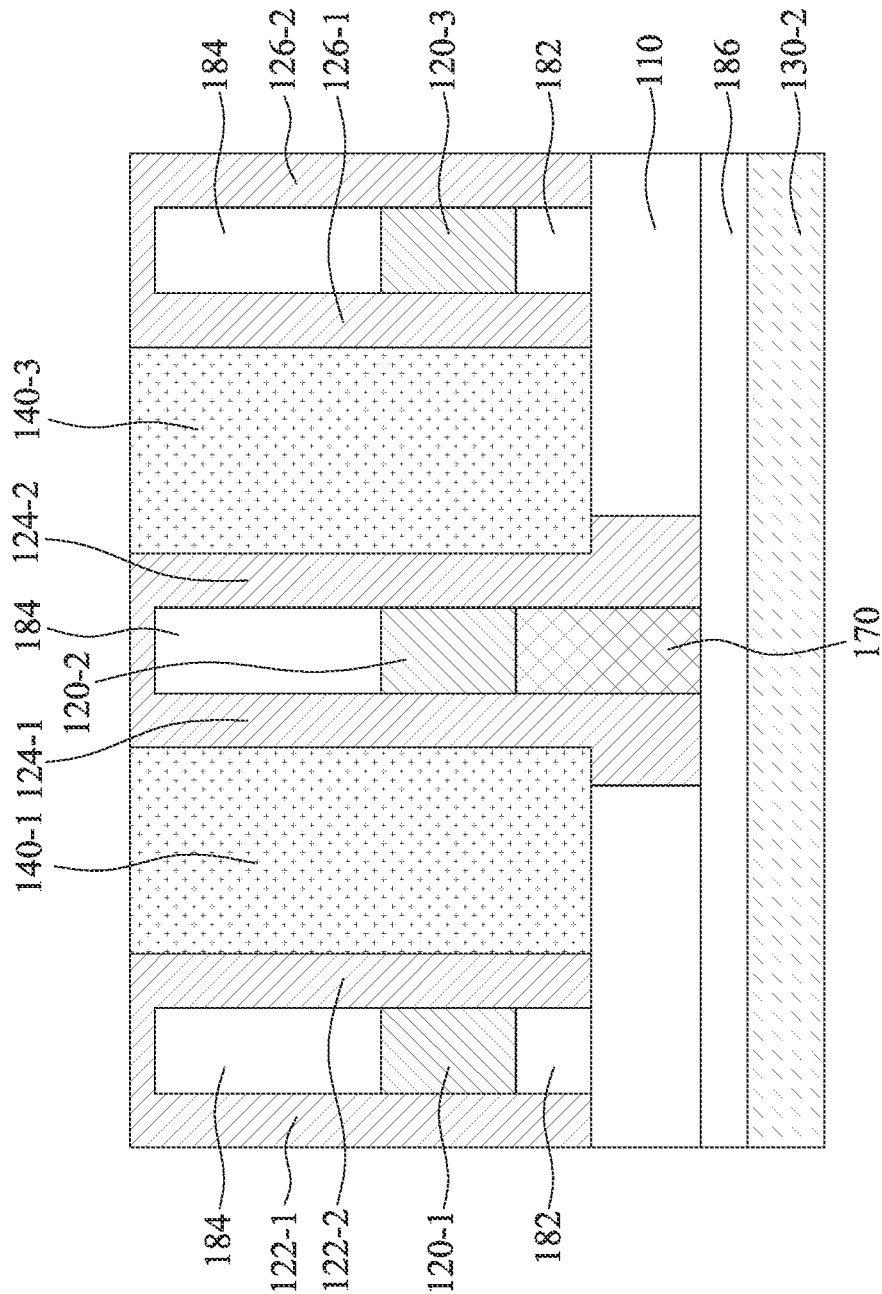
Figure 10:
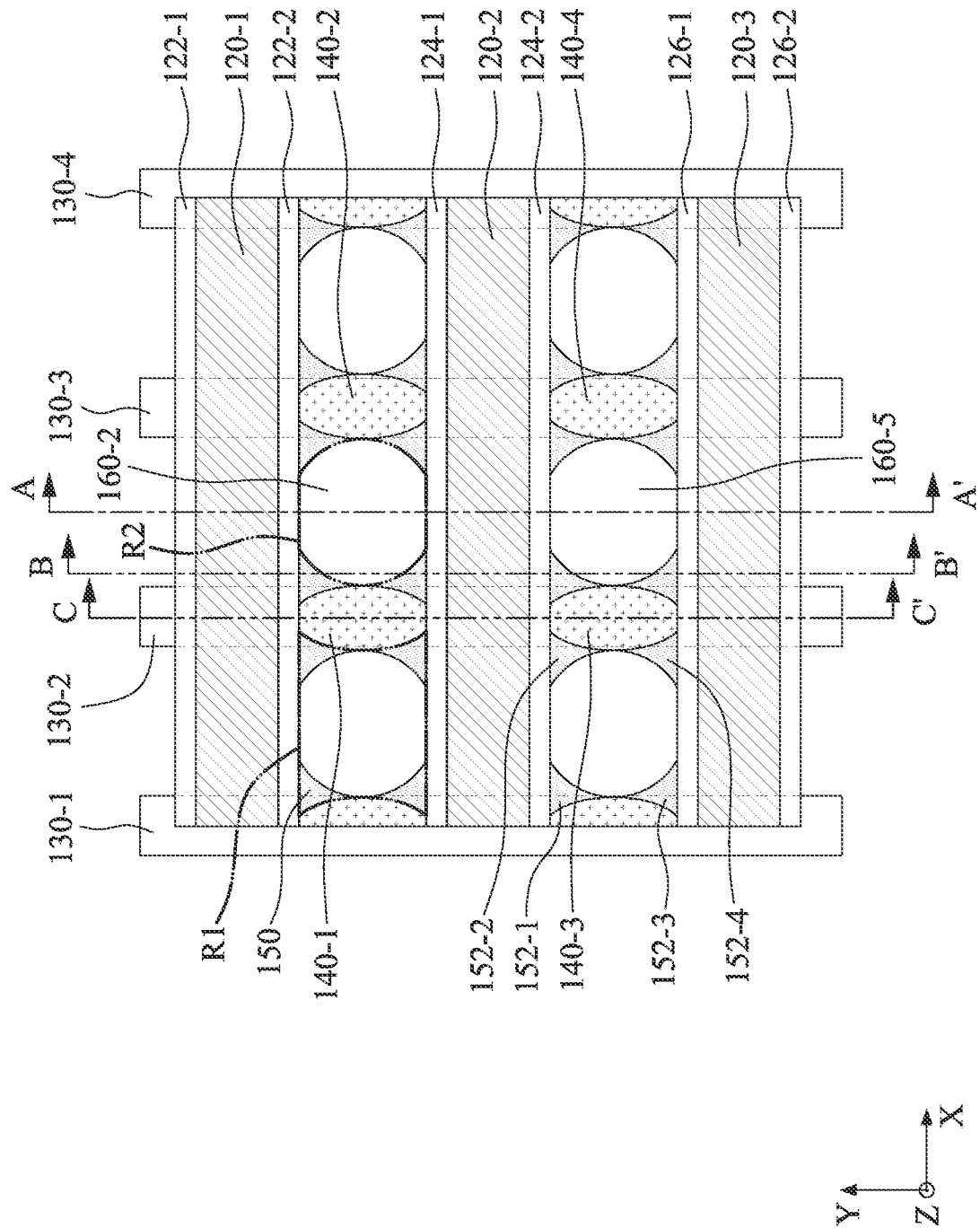
FIGS. 10, 10A, 10B, and 10C illustrate one or more stages of an example of a method for manufacturing a semiconductor package structure according to some embodiments of the present disclosure.
Figure 10A:
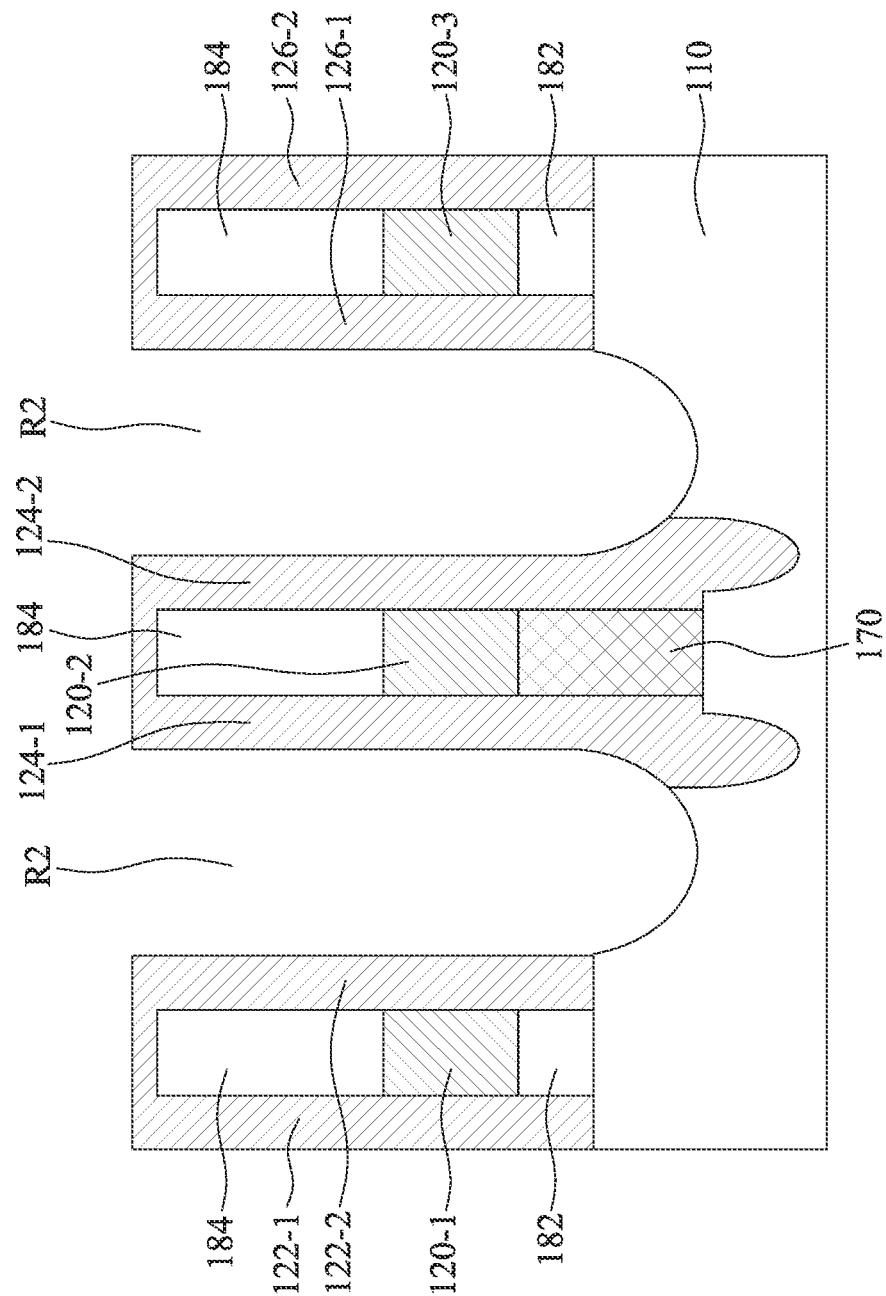
Figure 10B:
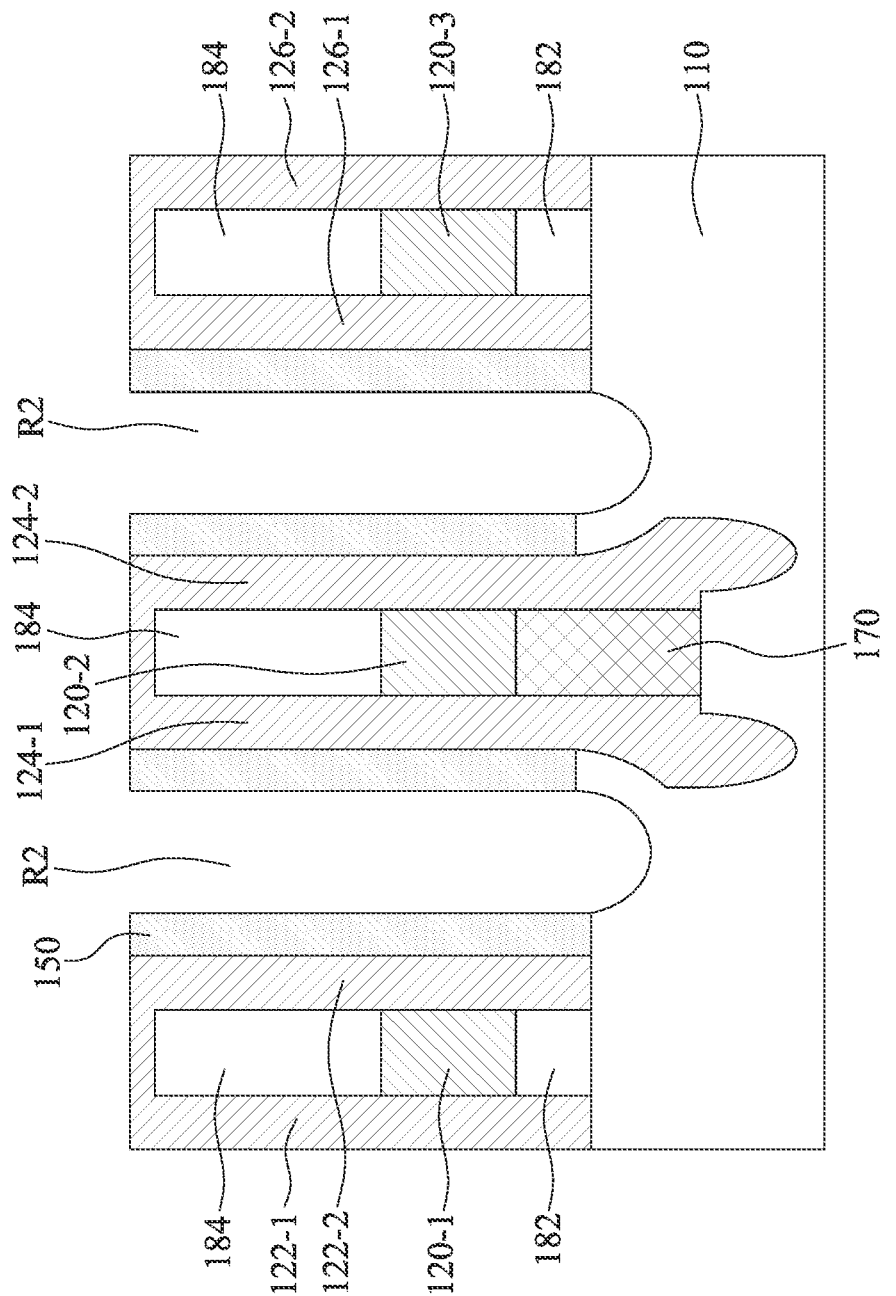
Figure 10C:
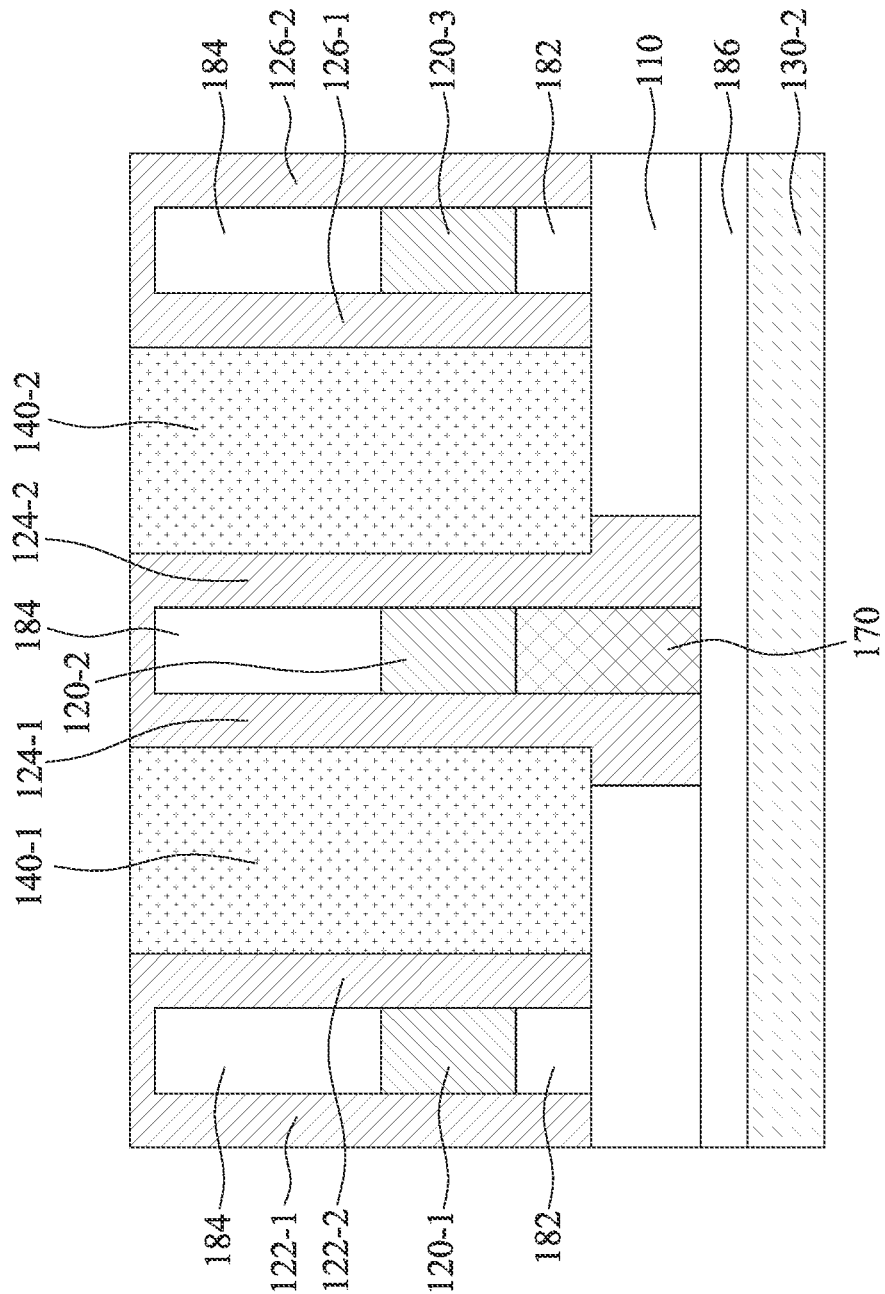
Figure 11:
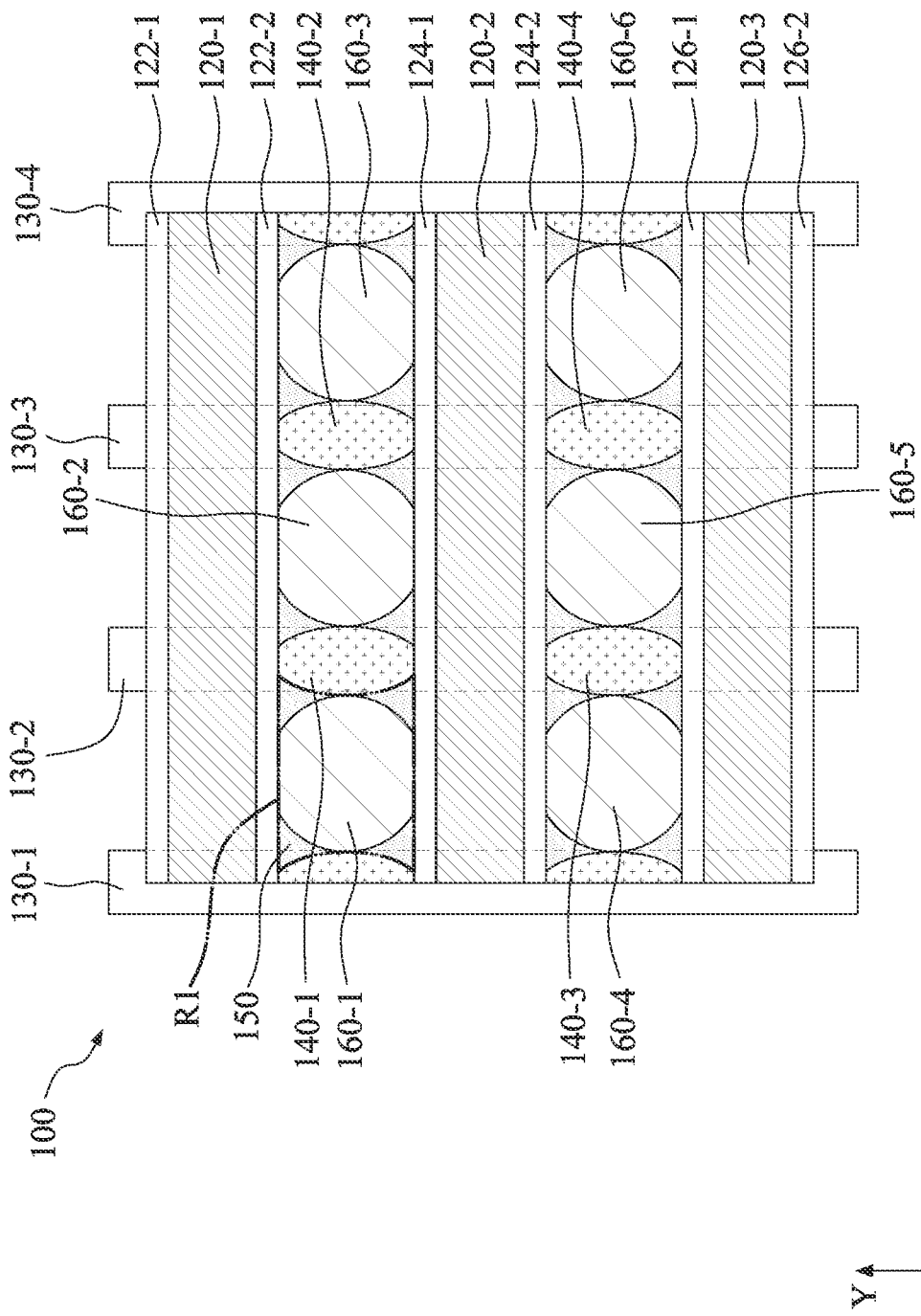
FIGS. 11, 11A, 11B, and 11C illustrate one or more stages of an example of a method for manufacturing a semiconductor package structure according to some embodiments of the present disclosure.
Figure 11A:
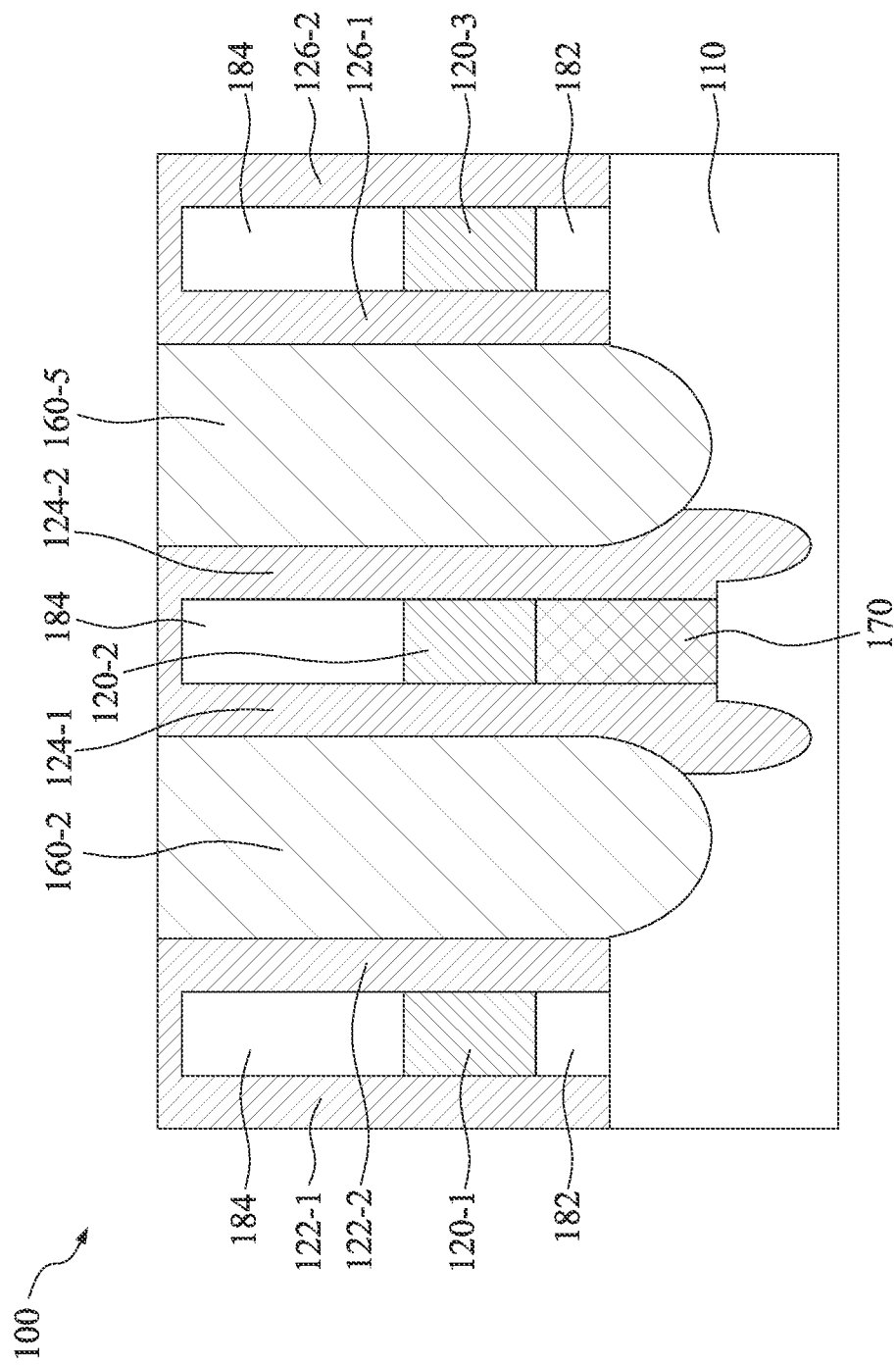
Figure 11B:
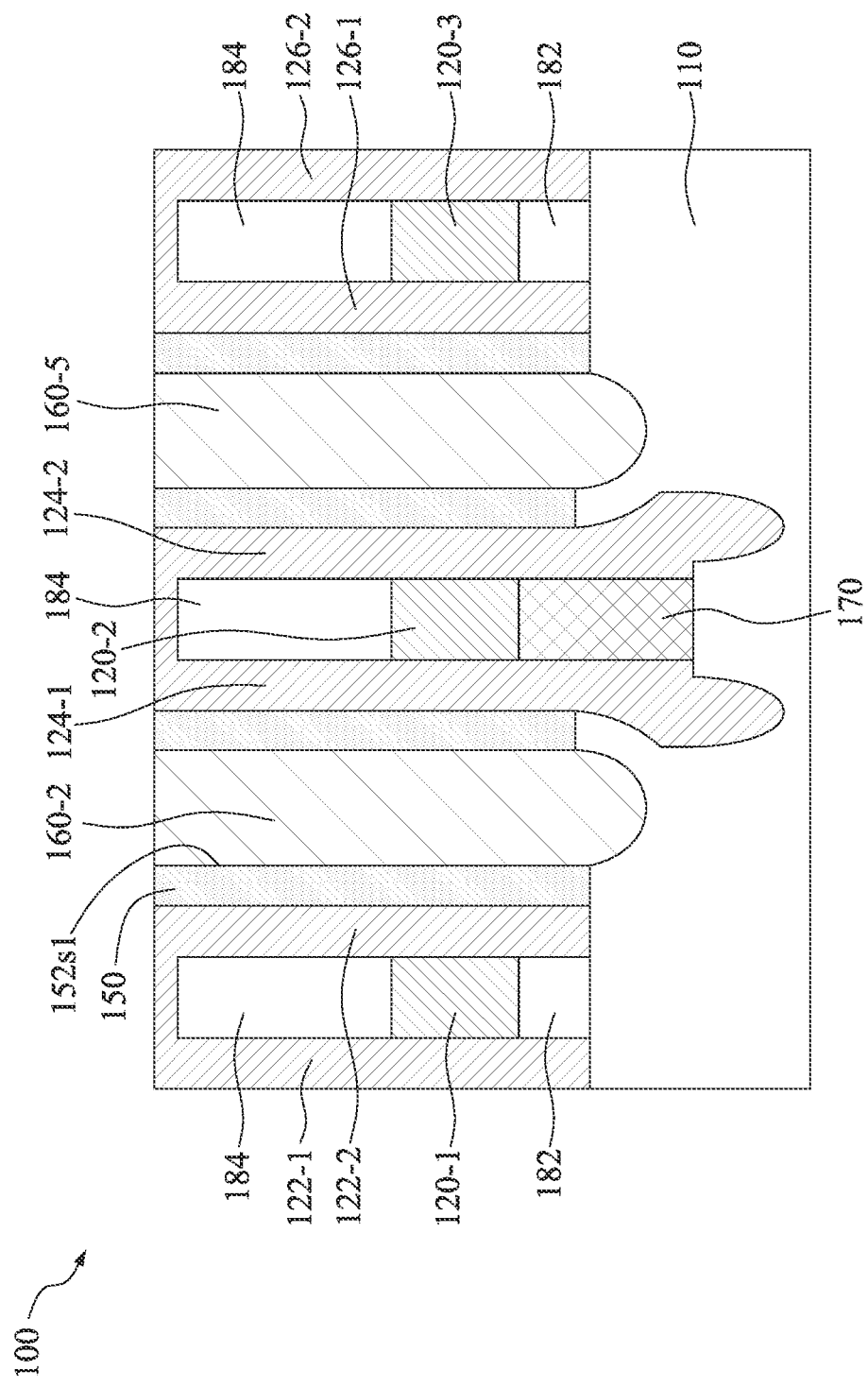
Figure 11C:
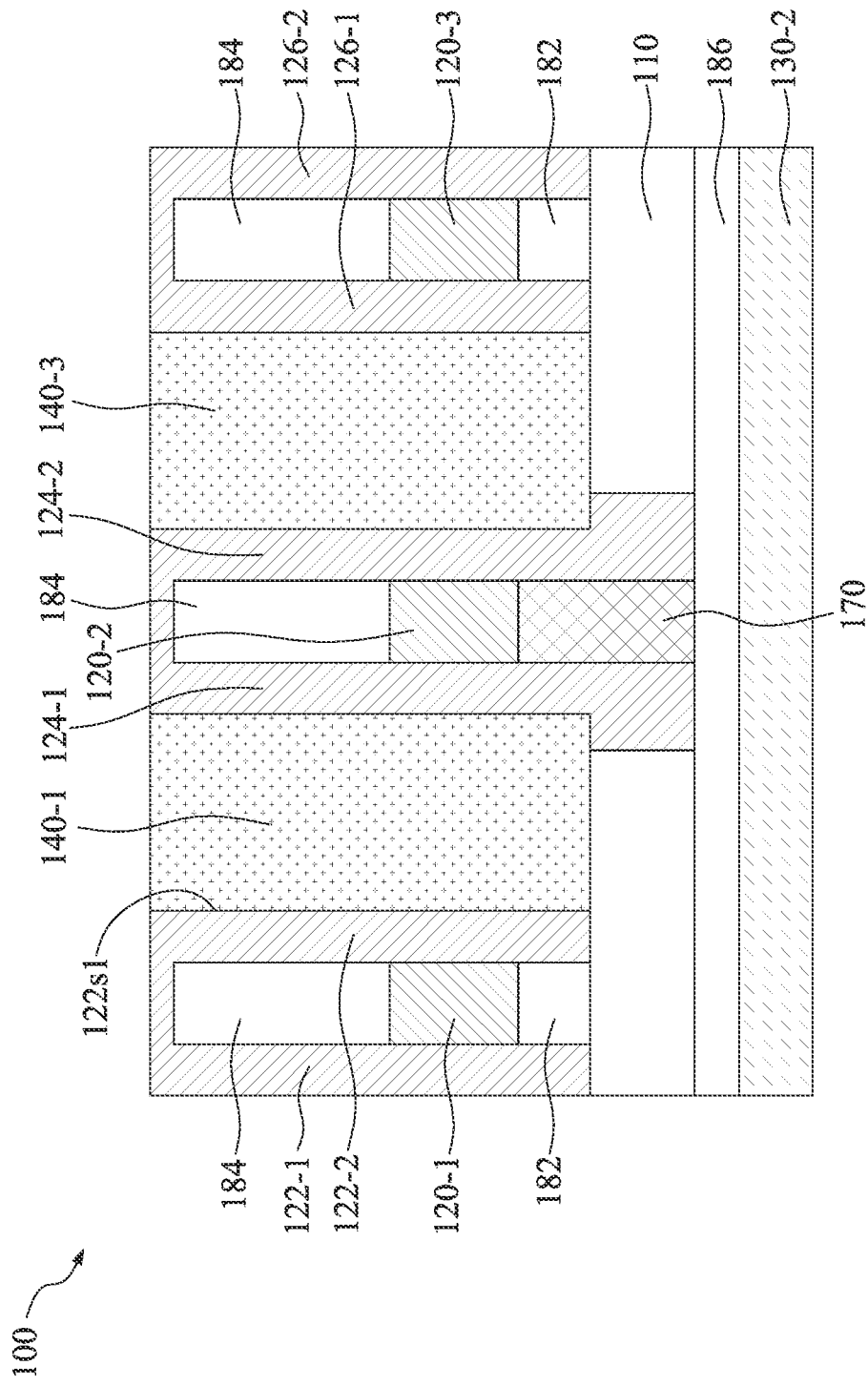

FIG. 4 is a schematic chart illustrating a method 300 of manufacturing a semiconductor device structure, in accordance with some embodiments of the present disclosure.

The method 300 begins with operation 310 in which a substrate is provided. A plurality of first metallization lines (e.g., word lines) can be formed within the substrate and extend along a first direction. A plurality of second metallization lines (e.g., bit lines) can be formed on the substrate and extend along a second direction orthogonal to the first direction. A plurality of spacers can be formed on sidewalls of the second metallization lines and extend along the second direction. A plurality of dielectric layers can be formed on the substrate and located between the spacers of the second metallization lines.

The method 300 begins with operation 320 in which an etching process is performed to remove a first portion of the dielectric layers. As a result, a plurality of openings of the dielectric layers can be formed. Each of the openings of the dielectric layer has a partial circle, a partial ellipse or a partial oval profile. Each of the openings of the dielectric layer can overlap the first metallization lines along a third direction orthogonal to the first direction and the second direction.

The method 300 begins with operation 330 in which a plurality of isolation features can be formed to fill the openings of the dielectric layers. Each of the isolation features has a partial circle, a partial ellipse or a partial oval profile. Each of the isolation features can overlap the first metallization lines along a third direction orthogonal to the first direction and the second direction.

The method 300 begins with operation 340 in which an etching process can be performed on a second portion of the dielectric layers. As a result, a plurality of apertures are formed, and an upper surface of the substrate is exposed. Each of the apertures is defined by the second metallization lines (or the spacers of the second metallization lines) and the isolation features, which have a partial circle, a partial ellipse or a partial oval profile. Each of the apertures can have a corner defined by the sidewall of the isolation feature and the sidewall of the spacer. Each of the corners of the aperture can be tapered toward the interface of the isolation feature and the spacer.

The method 300 begins with operation 350 in which a profile modifying material can be formed to cover the upper surface of the substrate, the sidewalls of the second metallization lines (or the sidewalls of the spacers), and the sidewalls of the isolation features. The profile modifying material can be conformally disposed on the upper surface of the substrate, the sidewalls of the spacers, and the sidewalls of the isolation features. The profile modifying material can occupy the corners of the apertures.

The method 300 begins with operation 360 in which an etching process can be performed to remove a portion of the profile modifying material so that an upper surface of the substrate can be exposed. The remaining profile modifying material forms profile modifiers to modify the profile of the apertures. Each of the profile modifiers can have a plurality of segments located at the corner defined by the sidewalls of the second metallization lines (or the sidewalls of the spacers) and the sidewalls of the isolation features. Each of the segments of the profile modifier can extend from the sidewall of the second metallization line (or the sidewall of the spacer) to the sidewall of the isolation feature. As a result, the aperture (or a modified aperture), defined by the spacers, the profile modifier, and/or the isolation features, can be rounded, and can have a partial circle, a partial ellipse or a partial oval profile.

The method 300 begins with operation 370 in which a conductive material can be deposited to fill the rounded apertures. As a result, a plurality of contact features can be formed within the rounded apertures. Each of the contact features can have a partial circle, a partial ellipse or a partial oval profile.

The method 300 is merely an example, and is not intended to limit the present disclosure beyond what is explicitly recited in the claims. Additional operations can be provided before, during, or after each operation of the method 300, and some operations described can be replaced, eliminated, or moved around for additional embodiments of the method. In some embodiments, the method 300 can include further operations not depicted in FIG. 4. In some embodiments, the method 300 can include one or more operations depicted in FIG. 4.

FIGS. 5, 5A, 5B, 5C, 6, 6A, 6B, 6C, 7, 7A, 7B, 7C, 8, 8A, 8B, 8C, 9, 9A, 9B, 9C, 10, 10A, 10B, 10C, 11, 11A, 11B, and 11C illustrate various stages of manufacturing A semiconductor device structure 100. FIGS. 5A, 6A, 7A, 8A, 9A, 10A, and 11A are cross-section views along line A-A' of FIG. 5, FIG. 6, FIG. 7, FIG. 8, FIG. 9, FIG. 10, and FIG. 11, respectively. FIGS. 5B, 6B, 7B, 8B, 9B, 10B, and 11B are cross-section views along line B-B' of FIG. 5, FIG. 6, FIG. 7, FIG. 8, FIG. 9, FIG. 10, and FIG. 11, respectively. FIGS. 5C, 6C, 7C, 8C, 9C, 10C, and 11C are cross-section views along line C-C' of FIG. 5, FIG. 6, FIG. 7, FIG. 8, FIG. 9, FIG. 10, and FIG. 11, respectively.

Referring to FIGS. 5, 5A, 5B, and 5C, a substrate 110 can be provided. A plurality of metallization lines 130-1, 130-2, 130-3, and 130-4 (e.g., word lines) can be formed within the substrate 110 and extend along the Y direction. A gate structure 170 (e.g., a bit gate) can be formed on the substrate 110. A plurality of metallization lines 120-1, 120-2, and 120-3 (e.g., bit lines) can be formed on the substrate 110 and extend along the X direction. The metallization lines 120-1, 120-2, and 120-3 can be formed on a respective gate structure 170. A plurality of spacers 122-1, 122-2, 124-1, 124-2, 126-1, and 126-2 can be formed on sidewalls of a respective metallization line (e.g., 120-1, 120-2, and 120-3). The spacers 122-1, 122-2, 124-1, 124-2, 126-1, and 126-2 can cover the sidewall of the gate structure 170 and the metallization lines 120-1, 120-2, and 120-3. A dielectric layer 182 can be formed between the substrate 110 and the metallization line (e.g., 120-1). A dielectric layer 184 can be formed on or over the metallization line (e.g., 120-1, 120-2, and 120-3). A plurality of dielectric layers 188 can be formed on the substrate 110. The dielectric layer 188 can be located between a pair of respective spacers 122-1, 122-2, 124-1, 124-2, 126-1, and 126-2. The dielectric layer can include SiN, SiO$_2$, silicon oxynitride (SiON), silicon carbon nitride (SiCN), silicon carbide (SiC), aluminum oxide (Al$_2$O$_3$), hafnium oxide (HfO$_2$), or lanthanum oxide (La$_2$O$_3$). In some embodiments, the dielectric layer 188 can include silicon oxide. In some embodiments, each of the spacers 122-1, 122-2, 124-1, 124-2, 126-1, and 126-2 can have a multilayer structure, including silicon nitride, silicon oxide or other suitable materials. In some embodiments, the outmost layer of the spacers 122-1, 122-2, 124-1, 124-2, 126-1, and 126-2 is made of silicon nitride.

Referring to FIGS. 6, 6A, 6B, and 6C, an etching process is performed. A portion of the dielectric layers 188 is removed. The portion of the dielectric layer 188 over the metallization lines 130-1, 130-2, 130-3, and 130-4 can be removed. As a result, a plurality of openings 188o can be formed. An upper surface of the substrate 110 can be exposed from the dielectric layer 180. Each of the openings 188o of the dielectric layer 188 can have a partial circle, a partial ellipse or a partial oval profile. The etching process can include a wet etching, or a dry etching process.

Referring to FIGS. 7, 7A, 7B, and 7C, a plurality of isolation features 140-1, 140-2, 140-3, and 140-4 can be formed to fill the openings 188o of the dielectric layer 188. Each of the isolation features 140-1, 140-2, 140-3, and 140-4 has a partial circle, a partial ellipse or a partial oval profile. Each of the isolation features 140-1, 140-2, 140-3, and 140-4 can overlap a respective metallization line 130-1, 130-2, 130-3, or 130-4 along the Z direction. The isolation features 140-1, 140-2, 140-3, and 140-4 can be formed by chemical vapor deposition (CVD), atomic layer deposition (ALD), physical vapor deposition (PVD), low-pressure chemical vapor deposition (LPCVD), or other suitable processes.

Referring to FIGS. 8, 8A, 8B, and 8C, an etching process can be performed. The remaining dielectric layer 188 can be removed. As a result, a plurality of apertures R1 are formed. Each of the apertures R1 is defined by the metallization line (e.g., 120-1, 120-2, and 120-3) (or the spacers of the metallization lines) and the isolation features (e.g., 140-1, 140-2, 140-3, and 140-4). Each of the apertures R1 can have a corner defined by the sidewall of the isolation feature 140-1, 140-2, 140-3, and 140-4 and the sidewall of the spacer 122-1, 122-2, 124-1, 124-2, 126-1, and 126-2. Each of the corners of the aperture R1 can be tapered toward the interface of the isolation feature (e.g., the 140-1, 140-2, 140-3, and 140-4) and the spacers (e.g., 122-1, 122-2, 124-1, 124-2, 126-1, and 126-2). The etching process can include a wet etching, or a dry etching process.

Referring to FIGS. 9, 9A, 9B, and 9C, a profile modifying material 150' can be formed to cover the upper surface of the substrate 110, the sidewalls of the spacers (e.g., 122-1, 122-2, 124-1, 124-2, 126-1, and 126-2), and the sidewalls of the isolation features (e.g., the 140-1, 140-2, 140-3, and 140-4). The profile modifying material 150' can be conformally disposed on the upper surface of the substrate 110, the sidewalls of the spacers (e.g., 122-1, 122-2, 124-1, 124-2, 126-1, and 126-2), and the sidewalls of the isolation features (e.g., the 140-1, 140-2, 140-3, and 140-4). The profile modifying material 150' can occupy the corners of the apertures R1. In some embodiments, the profile modifying material 150' can be formed by an ALD process or other suitable processes.

Referring to FIGS. 10, 10A, 10B, and 10C, an etching process can be performed to remove a portion of the profile modifying material 150'. In some embodiments, the etching process can include, for example, a dry etching process.

The remaining profile modifying material 150' forms profile modifiers 150 to modify the profile of the apertures R1. As a result, rounded apertures R2 can be formed. Each of the profile modifiers 150 can have a plurality of segments 152-1, 152-2, 152-3, and 152-4 located at the corners of the sidewalls of the spacers (e.g., 122-1, 122-2, 124-1, 124-2, 126-1, and 126-2) and the sidewalls of the isolation features (e.g., the 140-1, 140-2, 140-3, and 140-4). Each of the segments 152-1, 152-2, 152-3, and 152-4 of the profile modifier 150 can extend from the sidewall of the spacer (e.g., 122-1, 122-2, 124-1, 124-2, 126-1, and 126-2) to the sidewall of the isolation feature (e.g., the 140-1, 140-2, 140-3, and 140-4). As a result, the rounded aperture R2, defined by the spacers (e.g., 122-1, 122-2, 124-1, 124-2, 126-1, and 126-2), the profile modifier 150, and/or the isolation features (e.g., the 140-1, 140-2, 140-3, and 140-4) can have a partial circle, a partial ellipse or a partial oval profile.

In some embodiments, a portion of the substrate 110 can be removed so that the upper surface of the substrate 110 can be concaved.

Referring to FIGS. 11, 11A, 11B, and 11C, a conductive material can be deposited to fill the rounded apertures R2, thereby forming the semiconductor device structure 100. As a result, a plurality of contact features 160-1, 160-2, 160-3, 160-4, 160-5, and 160-6 can be formed. Each of the contact features 160-1, 160-2, 160-3, 160-4, 160-5, and 160-6 can have a partial circle, a partial ellipse or a partial oval profile.

When the conductive material is filled into the rounded aperture R2, no or fewer voids are formed at the corner of the sidewall of the isolation features (e.g., the 140-1, 140-2, 140-3, and 140-4) and the spacers (e.g., 122-1, 122-2, 124-1, 124-2, 126-1, and 126-2), which can improve yields of the semiconductor device structure 100. In a comparative example, no profile modifier is formed. As a result, voids of contact features may be generated at the corner of the isolation features and the spacers, having a negative influence on the electrical connection.

One aspect of the present disclosure provides a semiconductor device structure. The semiconductor device structure includes a first metallization line, a second metallization line, a first isolation feature, a second isolation feature, a profile modifier, and a contact feature. The first metallization line and the second metallization line extend along a first direction. The first isolation feature and the second isolation feature are disposed between the first metallization line and the second metallization line. The first metallization line, the second metallization line, the first isolation feature and the second isolation feature define an aperture. The profile modifier is disposed within the aperture to modify a profile of the aperture in a plan view. The contact feature is disposed within the aperture.

Another aspect of the present disclosure provides another semiconductor device structure. The semiconductor device structure includes a first metallization line, a second metallization line, a first isolation feature, a second isolation feature, a profile modifier, and a contact feature. The first metallization line and the second metallization line extend along a first direction. The first isolation feature and the second isolation feature are disposed between the first metallization line and the second metallization line. The first metallization line, the second metallization line, the first isolation feature and the second isolation feature define an aperture. The profile modifier is disposed within the aperture. The profile modifier includes a plurality of segments spaced apart from each other. Each of the segments are located at corners of the aperture. The contact feature is disposed within the aperture.

Another aspect of the present disclosure provides a method for manufacturing a semiconductor device structure. The method includes: providing a substrate; forming a first metallization line and a second metallization line over the substrate, wherein the first metallization line and the second metallization line extend along a first direction; forming a first isolation feature and a second isolation feature between the first metallization line and the second metallization line, wherein the first metallization line, the second metallization line, the first isolation feature and the second isolation feature define an aperture; forming a profile modifier to modify a profile of the aperture in a plan view; and forming a contact feature within the aperture.

The embodiments of the present disclosure illustrate a semiconductor device structure with a profile modifier. In some embodiments, the profile modifier can be utilized to round an aperture for accommodating a contact feature such that the contact feature can have a partial circle, a partial ellipse or a partial oval profile in a plan view. When a conductive material is filled into a rounded aperture to form the contact feature, no or fewer voids can be formed therein, which can improve yields of manufacturing the semiconductor device structure.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of manufacturing a semiconductor device structure, comprising:

forming a first metallization line and a second metallization line extending in a parallel;

forming a first isolation feature and a second isolation feature between the first metallization line and the second metallization line and perpendicularly extended between the first metallization line and the second metallization line, wherein the first metallization line, the second metallization line, the first isolation feature and the second isolation feature define an aperture and form a boundary of the aperture;

forming a profile modifier within the aperture, wherein the profile modifier comprises a plurality of segments spaced apart from each other, wherein each of the segments are located at corners of the aperture; and forming a contact feature surrounded by the plurality of segments.

2. The method of claim 1, wherein one of the plurality of segments is tapered toward one of the corners defined by the first metallization line and the first isolation feature.

3. The method of claim 1, wherein the profile modifier rounds a profile of the aperture in the plan view.

4. The method of claim 1, wherein a sidewall of the first isolation feature and a sidewall, facing the sidewall of the first isolation feature, of the second sidewall protrude toward each other.

5. The method of claim 1, wherein the first isolation feature has a convex sidewall convex in direct contact with the profile modifier.

6. The method of claim 1, further comprising:

forming a first spacer on a sidewall of the first metallization line; and forming a second spacer on a sidewall of the second metallization line, and the aperture is defined by the first spacer, the second spacer, the first isolation feature, and the second isolation feature, such that the boundary of the aperture is defined by the first spacer, the second spacer, a sidewall of the first isolation feature and a sidewall of the second isolation feature.

7. The method of claim 6, wherein one of the plurality of segments is tapered toward an interface between the first spacer and the first isolation feature.

8. The method of claim 6, wherein the profile modifier is in contact with the sidewall of the first spacer.

9. The method of claim 6, wherein a portion of a sidewall of the first spacer is exposed from the profile modifier.

10. The method of claim 6, wherein one of the plurality of segments of the profile modifier has a sidewall extending from the sidewall of the first spacer to a sidewall of the first isolation feature.

11. The method of claim 1, wherein a portion of a sidewall of the first isolation feature is exposed from the profile modifier.

12. A method of manufacturing a semiconductor device structure, comprising:
providing a substrate;
forming a first metallization line and a second metallization line over the substrate, wherein the first metallization line and the second metallization line extending along a first direction;
forming a third metallization line and a fourth metallization line extending along a second direction different from the first direction;
forming a first isolation feature and a second isolation feature between the first metallization line and the second metallization line, wherein the first isolation feature and the second isolation feature extend along a third direction, wherein the first metallization line, the second metallization line, the first isolation feature and the second isolation feature define an aperture, wherein the aperture has a profile defining two opposed first sidewalls formed between sidewalls of the first and second metallization lines respectively and two opposed second sidewalls formed between sidewalls of the first and second isolation features respectively, wherein the first sidewalls and the second sidewalls of the aperture form a boundary thereof;
forming a profile modifier within the aperture to modify the profile of the aperture in a plan view; and
forming a contact feature within the aperture and surrounded by the profile modifier.

13. The method of claim 12, further comprising:
forming a dielectric layer between the first metallization line and the second metallization line;
forming a first opening and a second opening defined by the dielectric layer; and
filling an isolation material to form the first isolation feature and the second isolation feature.

14. The method of claim 13, wherein each of the first opening and the second opening has a partial circle profile, a partial ellipse profile or a partial oval profile in a plan view.

15. The method of claim 13, further comprising:
removing the dielectric layer between the first isolation feature and the second isolation feature to form the aperture;
forming a profile modifying material within the aperture; and
removing a portion of the profile modifying material to form the profile modifier.

16. The method of claim 15, wherein the profile modifying material is conformally formed on a sidewall of the aperture and on an upper surface of the substrate, and removing a portion of the profile modifying material comprises:
removing the profile modifying material on the upper surface of the substrate; and
removing a portion of the substrate.

17. The method of claim 16, wherein after the portion of the profile modifying material is removed, the profile modifier is located at corners of the aperture, and the contact feature has a partial circle profile, a partial ellipse profile or a partial oval profile in the plan view.

18. The method of claim 12, further comprising:
forming a first spacer on the sidewall of the first metallization line; and
forming a second spacer on the sidewall of the second metallization line,
wherein the aperture is defined by the first isolation feature, the second isolation feature, the first spacer and the second spacer.

19. The method of claim 18, wherein forming the profile modifier to modify the profile of the aperture comprises:
forming a profile modifying material within the aperture; and
removing a portion of the modifying material to form the profile modifier, wherein the profile modifier has a sidewall extending from the first spacer to the first isolation feature.

20. The method of claim 18, further comprising:
forming a rounded aperture after forming the profile modifier, wherein a profile of the rounded aperture is defined at least by the profile modifier, and the contact feature is formed within the rounded aperture.

* * * * *